United States Patent
Fukasawa et al.

(10) Patent No.: US 6,246,249 B1
(45) Date of Patent: *Jun. 12, 2001

(54) SEMICONDUCTOR INSPECTION APPARATUS AND INSPECTION METHOD USING THE APPARATUS

(75) Inventors: Norio Fukasawa; Yukinori Sumi, both of Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/944,489

(22) Filed: Oct. 6, 1997

(30) Foreign Application Priority Data

Mar. 19, 1997 (JP) .................................... 9-066912

(51) Int. Cl.⁷ ...................................... G01R 31/26
(52) U.S. Cl. ............................. 324/765; 324/762
(58) Field of Search ...................... 324/765, 755, 324/750, 158.1, 754, 761, 760, 758, 762

(56) References Cited

U.S. PATENT DOCUMENTS

| 4,048,438 | * | 9/1977 | Zimmerman | 174/154 |
|---|---|---|---|---|
| 5,196,726 | * | 3/1993 | Nishiguchi et al. | 257/737 |
| 5,329,423 | * | 7/1994 | Scholz | 361/760 |
| 5,576,630 | * | 11/1996 | Fujita | 324/760 |
| 5,578,934 | * | 11/1996 | Wood et al. | 324/758 |
| 5,625,298 | * | 4/1997 | Hirano et al. | 324/754 |
| 5,721,496 | * | 2/1998 | Farnworth et al. | 324/765 |
| 5,915,977 | * | 6/1999 | Hembree et al. | 439/74 |
| 5,985,682 | * | 11/1999 | Higgins, III | 438/10 |

FOREIGN PATENT DOCUMENTS 5-326635  12/1993  (JP) .

* cited by examiner

Primary Examiner—Ernest Karlsen
Assistant Examiner—Minh Tang
(74) Attorney, Agent, or Firm—Armstrong, Westerman, Hattori, McLeland & Naughton, LLP

(57) ABSTRACT

A semiconductor inspection apparatus performs a test on a to-be-inspected device which has a spherical connection terminal. This apparatus includes a conductor layer formed on a supporting film. The conductor layer has a connection portion. The spherical connection terminal is connected to the connection portion. At least a shape of the connection portion is changeable. The apparatus further includes a shock absorbing member, made of an elastically deformable and insulating material, for at least supporting the connection portion.

4 Claims, 30 Drawing Sheets

(VIBRATION)

SEMICONDUCTOR INSPECTION APPARATUS AND INSPECTION METHOD USING THE APPARATUS

BACKGROUND OF THE INVENTION

1. Field of the Invention

The present invention relates to a semiconductor inspection apparatus and an inspection method using the apparatus, and, in particular, to a semiconductor inspection apparatus and an inspection method using the apparatus which is suitable for inspection of a semiconductor chip, having spherical connection terminals, and a semiconductor device (to-be-inspected device).

Recently, a semiconductor device is demanded to have a higher density, a higher speed and to be miniaturized. In order to meet the demand, a mounting method in which a plurality of semiconductor chips, each of which is not sealed by a package (a bare chip so-called), or a plurality of semiconductor devices of the BGA (Ball Grid Array) structure are directly loaded on a circuit substrate has been used.

In this mounting method, if one of the thus-arranged plurality of bare chips or semiconductor devices has a defect, the entire apparatus is defective. Accordingly, high reliability is demanded for the individual bare chips or semiconductor devices.

Therefore, an inspection of examining as to whether or not the individual bare chips or semiconductor devices function normally has been important.

2. Description of the Related Art

In the related art, as an inspection method for a semiconductor device (hereinafter, a bare chip which is not sealed with resin and a semiconductor device which is sealed with resin are generically referred to as 'semiconductor devices') which has spherically projecting spherical connection terminals on the bottom surface thereof, various inspection methods have been proposed and have been performed practically.

When performing an electrical operation inspection on such a type of semiconductor device, inspection needles of an inspection apparatus are caused to come into contact with the spherical connection terminals. It is necessary to perform electrical connection inspection of the respective spherical connection terminals with a little deterioration of the spherical connection terminals as possible. Further, high reliability and low-cost inspection is demanded.

As a semiconductor inspection apparatus in the related art, for example, there is an apparatus using a semiconductor test socket. This semiconductor socket is arranged so as to use probes (inspection needles) and thus inspect electrical operation of a semiconductor device. In this inspection method, a plurality of probes are arranged on an inspection substrate for corresponding to the plurality of spherical connection terminals formed on the bottom surface of the semiconductor device. In this inspection method, the extending ends of the probes are caused to directly come into contact with the spherical connection terminals and inspection is performed.

That is, this semiconductor test socket has the plurality of probes which are provided in the same arrangement as that of the plurality of spherical connection terminals of the semiconductor device. These probes have U-shaped bending portions, respectively. When the extending ends of the probes come into contact with the spherical connection terminals of the semiconductor device and are pressed, the bending portions bend and damage to the spherical connection terminals is reduced.

However, when electrical inspection of the semiconductor device is performed in the above-described probe inspection method, because the heights of the spherical connection terminals vary from each other, a case where connection with the probe may not be sufficient occurs. Thereby, inspection accuracy may be degraded.

Further, although the U-shaped bending portions are provided, when the extending ends of the probes come into contact with the spherical connection terminals, the shapes of the spherical connection terminals, which are formed of solder, may be changed.

SUMMARY OF THE INVENTION

The present invention is devised in consideration of the above-described problems, and an object of the present invention is to provide a semiconductor inspection apparatus and an inspection method using the apparatus which can perform inspection of a to-be-inspected semiconductor device having the spherical connection terminals, with high reliability without changing the shapes of the spherical connection terminals.

In order to solve these problems, the present invention uses various means.

A first semiconductor inspection apparatus, according to the present invention, for performing a test on a to-be-inspected device which has a spherical connection terminal, comprises:

a conductor layer formed on a supporting film, the conductor layer having a connection portion, the spherical connection terminal is connected to the connection portion, at least a shape of the connection portion being changeable;

shock absorbing member, made of an elastically deformable and insulating material, for at least supporting the connection portion.

In a second semiconductor inspection apparatus according to the present invention, the connection portion has a single-layer or multilayer stacked stud bump projecting toward the spherical connection terminal which is loaded on the apparatus.

In a third semiconductor inspection apparatus according to the present invention, the multilayer stacked stud bump is made of different kinds of metals.

In a fourth semiconductor inspection apparatus according to the present invention, a surface of the connection portion is roughened.

In a fifth semiconductor inspection apparatus according to the present invention, a surface of the connection portion has a metal film formed thereon, the material of the metal film being different from the material of the connection portion.

In a sixth semiconductor inspection apparatus according the present invention, a cut portion is formed in the shock absorbing member.

In a seventh semiconductor inspection apparatus according to the present invention, the shock absorbing member comprises a combination of a plurality of division members.

In an eighth semiconductor inspection apparatus according to the present invention, the connection portion includes a ring-shaped portion and extending portions which extend from the ring-shaped portion toward the center of the ring-shaped portion.

In a ninth semiconductor inspection apparatus according to the present invention, the connection portion has a nail-head shape.

In a tenth semiconductor inspection apparatus according to the present invention, a cut portion is formed in the supporting film.

In an eleventh semiconductor inspection apparatus according to the present invention, the supporting film comprises a combination of a plurality of division film members.

In a twelfth semiconductor inspection apparatus according to the present invention, an electronic device is provided on a substrate which comprises the conductor layer and the supporting film.

In a thirteenth semiconductor inspection apparatus according to the present invention, a projection portion is formed to the shock absorbing member at a position at which the shock absorbing member faces the connection portion, the projecting member projecting toward the connection portion.

In a fourteenth semiconductor inspection apparatus according to the present invention, a supporting portion which supports the shock absorbing member is provided.

In a fifteenth semiconductor inspection apparatus according to the present invention, the supporting member has one of a depression and a projection formed thereto at a position at which the supporting member faces the connection portion.

In a sixteenth semiconductor inspection apparatus according to the present invention, a positioning mechanism which performs positioning between the to-be-inspected device having the spherical connection terminal and the connection portion is provided.

In a seventeenth semiconductor inspection apparatus according to the present invention, a guide pin is used as the positioning mechanism.

In an eighteenth semiconductor inspection apparatus according to the present invention, a guide-pin-attached frame is used as the positioning mechanism, the guide-pin-attached frame comprising a frame portion which holds the to-be-inspected device and a guide pin which is integrated with the frame portion.

In a nineteenth semiconductor inspection apparatus according to the present invention, the frame portion of the guide-pin-attached frame covers and holds the to-be-inspected device, and a taper surface for positioning the to-be-inspected device is formed on an inner surface of the frame portion.

In a twentieth semiconductor inspection apparatus according to the present invention, an aligning mechanism is formed to the frame portion, the aligning mechanism performing an aligning process on the to-be-inspected device so that the spherical connection terminal can be positioned at the connection portion.

In a twenty-first semiconductor inspection apparatus according to the present invention, a pressing mechanism is provided to the frame portion, the pressing mechanism pressing the to-be-inspected device in a loaded condition to the conductor layer.

In a twenty-second semiconductor inspection apparatus according to the present invention, an elastic member having a shock absorbing function is provided between the frame portion and the to-be-inspected device.

In a twenty-third semiconductor inspection apparatus according to the present invention, a positioning substrate is used as the positioning mechanism, the positioning substrate being located so as to face the to-be-inspected device which is loaded on the conductor layer, the positioning substrate having a hole which has a shape corresponding to the spherical connection terminal.

In a twenty-fourth semiconductor inspection apparatus according to the present invention, a drawing mechanism for drawing the spherical connection terminal is provided to the positioning substrate.

In a twenty-fifth semiconductor inspection apparatus according to the present invention, a substrate positioning mechanism for performing positioning between the hole and the connection portion is provided.

A first inspection method according to the present invention using any one of the above-described first through twenty-fifth semiconductor inspection apparatuses, the inspection method comprising the step of pressing the spherical connection terminal to the connection portion formed in the conductor layer so that elastic deformation occurs in the connection portion of the conductor layer and the shock absorbing member, the elastic restoring force occurring in the connection portion and the shock absorbing member due to the elastic deformation causing the connection portion to be pressed to the spherical connection terminal so that electrical connection therebetween is provided.

A second inspection method according to the present invention using any one of the above-described twenty-third through twenty-fifth semiconductor inspection apparatuses, the inspection method comprising the steps of inserting the spherical connection terminal into the hole of the positioning substrate and thus positioning the spherical connection terminal, then causing the spherical connection terminal to be electrically connected with the connection terminals while maintaining the condition where the positioning has been performed, and performing a test of the to-be-inspected device.

A third inspection method according to the present invention using the above-described twenty-third semiconductor inspection apparatus, the inspection method comprising the step of vibrating at least one of the positioning substrate and the to-be-inspected device and thus positioning the spherical connection terminal in the hole of the positioning substrate.

A fourth inspection method according to the present invention using the above-described twenty-fourth semiconductor inspection apparatus, the inspection method comprising the steps of forming a suction path in the positioning substrate and connecting a suction apparatus to the suction path, and positioning the spherical connection terminal in the hole of the positioning substrate as a result of the spherical connection terminal being drawn to the suction path.

A fifth inspection method according to the present invention using the above-described twenty-fourth semiconductor inspection apparatus, the inspection method comprising the steps of forming the positioning substrate of a porous material and connecting a suction apparatus to the positioning substrate, positioning the spherical connection terminal in the hole of the positioning substrate as a result of the spherical connection terminal being drawn to the positioning substrate.

In the above-described first semiconductor inspection apparatus, the shape of the connection portion of the conductor layer can change, to which connection portion the spherical connection terminal is connected. Accordingly, the shape of the connection portion changes along the outer shape of the spherical connection terminal in the condition where the to-be-inspected device is loaded on the semiconductor inspection apparatus. Thereby, the contact area between the connection portion and the spherical connection terminal increases, and, thus, electrical connection therebetween can be ensured.

In order to enable change of the shape of the connection portion, it is necessary to form the conductor layer to be thin. Thereby, the mechanical strength of the conductor layer may be degraded. However, because the conductor layer is supported on the supporting film, the mechanical strength of the conductor layer is maintained.

For the connection portions, the supporting film may not be provided so that improved electrical connection with the spherical connection terminal can be provided. Because the supporting film is not provided for the connection portions, the mechanical strength of the connection portions would normally be degraded. However, the connection portion is supported by the shock absorbing member. The shock absorbing member is made of an elastically deformable insulating material. Accordingly, when a strong force is applied to the connection portion, the shock absorbing function of the shock absorber prevents permanent deformation of the connection portion. As a result, stable inspection can always be performed.

In the above-described second semiconductor inspection apparatus, the single layer or multi-layer stacked stud bump is provided on the connection portion, and the stud bump projects toward the spherical connection terminal which is being loaded. Thereby, the electrical connection with the spherical connection terminal can be improved. Further, by appropriately selecting the number of stacked layers of the stud bump, the height of the stud bump can be easily adjusted so that the connection with the spherical connection terminal can be the best electrical connection.

Further, the stud bump can be formed by using the wire bonding technique which is generally used as a semiconductor manufacturing technique. Accordingly, the stud bump can be formed at a low cost and efficiently.

In the above-described third semiconductor inspection apparatus, by forming the multilayer stacked stud bumps of the different kinds of metals, the material of the projecting-end-portion stud bump can be selected so that the compatibility between the material of the projecting-end-portion stud bump and the material of the spherical connection terminal is good. Also, the material of the other stud bump can be selected so that the compatibility between the material of the stud bump and the material of the connection portion is good, and, also, the compatibility between the material of the stud bump and the material of the projecting-end-portion stud bump or another stud bump is good.

Thus, the connection between the projecting-end-portion stud bump and the spherical connection terminal can be a good connection, the connection between the projecting-end-portion stud bump and the other stud bump can be a good connection, and the connection between the stud bump and the connection portion can be a good connection. Further, in a case where the lower stud bump includes a plurality of stacked stud bumps, the connection between each pair of adjacent stud bumps of the plurality of stacked stud bumps 16B can be a good connection.

In the above-described fourth semiconductor inspection apparatus, by roughening the surfaces of the connection portion, the thus-formed roughened surface has minute unevenness thereon, and thus, the substantial surface area thereof is large. When the spherical connection terminal 2 comes into contact with the connection portion, the minute projections of the roughened surface dig into the spherical connection terminal 2. Thereby, electrical connection between the connection portion and the spherical connection terminal can be ensured.

In the above-described fifth semiconductor inspection apparatus, the different kind of metal film is provided on the surface of the connection portion. The different kind of metal film provides a good connection with the spherical connection terminal, and also, provides a good connection with the connection portion. Accordingly, even if the direct connection between the connection portion and the spherical connection terminal is not a good connection, the connection between the connection portion and the spherical connection terminal can be a good electrical connection as a result of inserting the different kind of metal film between the connection portion and the spherical connection terminal. Thereby, the electrical connection between the connection portion and the spherical connection terminal can be improved, and also, the connection portion can be protected.

In the above-described sixth and seventh semiconductor inspection apparatuses, by forming the cut portions in the shock absorbing member, or by forming the shock absorbing member to be the combination of the plurality of division members, the elasticity of the shock absorbing member increases due to the shape thereof. Thereby, the shock absorbing function of the shock absorbing member increases. Accordingly, projection of the connection portion can be ensured.

In the above-described eighth semiconductor inspection apparatus, the connection portion includes the ring-shaped portion and the extending portion which extends from the ring-shaped portion toward the center of the ring-shaped portion. Thereby, the shape of the extending portion can be easily changed. Accordingly, the shape of the extending portion easily changes along the outer shape of the spherical connection terminal. As a result, it is possible to surely connect the connection portion and spherical connection terminal with one another with a weak pressing force.

In the above-described ninth semiconductor inspection apparatus, as a result of the connection portion having a nail head shape, the connection portion is supported as a cantilever. Accordingly, the shape of the connection portion easily changes as a result of the spherical connection terminal being loaded. As a result, it is possible to surely connect the connection portion and spherical connection terminal with one another with a weak pressing force.

In the above-described tenth and eleventh semiconductor inspection apparatuses, by forming the cut portion in the supporting film, it is possible that the supporting film has elasticity. Further, by forming the supporting film to be the combination of the plurality of division film members, a gap can be formed between each pair of adjacent division film members. Thereby, various stresses which occur when the to-be-inspected device is loaded are absorbed as a result of the shape of the supporting film being changed, or as a result of the division film members moving in the gaps. Thereby, it is possible to prevent unnecessary stresses from being applied to the position at which the spherical connection terminal comes into contact with the connection portion.

In the above-described twelfth semiconductor inspection apparatus, as a result of the electronic device being provided on the substrate which includes the conductor layer and supporting film, part or all of a semiconductor inspection process which is performed on the to-be-inspected device can be performed by the electronic device provided on the substrate.

In the above-described thirteenth semiconductor device, the projection portion is formed to the shock absorbing member at the position at which the shock absorbing member faces the connection portion. The projecting portion projects toward the connection portion. Thus, the distance between the projection portion and the connection portion is small. Accordingly, protection of the connection portion can be ensured.

In the above-described fourteenth semiconductor inspection apparatus, by providing the supporting member which supports the shock absorbing member, the supporting member can support the shock absorbing member, the shape of the shock absorbing member elastically changing. Thereby, it can be prevented that the shape of the shock absorbing member unnecessary changes. Further, it can also be prevented that the shock absorbing member moves from a predetermined position.

In the above-described fifteenth semiconductor inspection apparatus, the supporting member has one of a depression and a projection formed thereto at a position at which the supporting member faces the connection portion. For example, in the case where the depression is formed in the supporting member, even if the spherical connection terminal is pressed with an excessive pressing force, and thereby, a large change of the shape of the shock absorbing member occurs, this large change of the shape of the shock absorbing member can be received by the depressions. Accordingly, it is possible to maintain the shock absorbing function of the shock absorbing member.

In the case where the projection is formed on the supporting member, even if the spherical connection terminals are pressed with an excessive pressing force, and thereby, a large change of the shape of the shock absorbing member would normally occur, the shock absorbing member comes into contact with the projection and thus the shape of the shock absorbing member cannot change more. Accordingly, the change of the shape of the shock absorbing member is restrained by the projection and actually a large change of the shape of the shock absorbing member does not occur. Thereby, the shock absorbing member can be protected. Therefore, according to a desired one of the above-mentioned functions, the depression or the projection may be selected.

In the above-described sixteenth semiconductor inspection apparatus, the positioning mechanism which performs the positioning between the spherical connection terminal and the connection portion is provided. Thereby, the positioning between the spherical connection terminal and the connection portion can be easily and accurately performed. Accordingly, reliability of the connection between the spherical connection terminal and connection terminal can be improved.

In the above-described seventeenth semiconductor inspection apparatus, the guide pin is used as the positioning mechanism. Thereby, the positioning between the spherical connection terminal and the connection portion can be performed with a simple arrangement.

In the above-described eighteenth semiconductor inspection apparatus, the guide-pin-attached frame is used as the positioning mechanism, the guide-pin-attached frame comprising the frame portion which holds the to-be-inspected device and a guide pin which is integrated with the frame portion. Thereby, the to-be-inspected device itself (the outer shape of the device and so forth) can be used to provide a reference position for positioning of the to-be-inspected device. Accordingly, high-accuracy positioning can be performed.

In the above-described nineteenth semiconductor inspection apparatus, the frame portion of the guide-pin-attached frame covers and holds the to-be-inspected device, and the taper surface for positioning the to-be-inspected device is formed on an inner surface of the frame portion. Accordingly, merely by inserting the to-be-inspected device into the frame portion, the to-be-inspected device is guided by the taper surface and positioned at a predetermined loading position. Thus, the positioning process of the to-be-inspected device, that is, the positioning between the spherical connection terminal and the connection portion can be easily performed.

In the above-described twentieth semiconductor inspection apparatus, the aligning mechanism is formed to the frame portion, the aligning mechanism performing the aligning process on the to-be-inspected device. Accordingly, even if the position of the spherical connection terminal is not coincident with the position of the connection portion immediately after the to-be-inspected device 1 is inserted into the frame portion, the aligning mechanism performs the aligning process and thus the position of the spherical connection terminal become coincident with the position of the connection portion.

In the above-described twenty-first semiconductor inspection apparatus, the pressing mechanism is provided to the frame portion, the pressing mechanism pressing the to-be-inspected device in the loaded condition to the conductor layer. Thereby, a predetermined pressing forth is applied between the spherical connection terminal and the connection portion. As a result, electrical connection therebetween can be improved, and also, the spherical connection terminal can be prevented from shifting from the connection portion during measurement.

In the above-described twenty-second semiconductor inspection apparatus, the elastic member having the shock absorbing function is provided between the frame portion and the to-be-inspected device. Accordingly, even if an excessive pressing forth or an unnecessary external force is applied, the stress due to the pressing force or the external force is absorbed by the elastic member. Thus, the spherical connection terminal and the connection portion can be prevented from being damaged.

In the above-described twenty-third semiconductor inspection apparatus, the positioning substrate is used as the positioning mechanism, the positioning substrate being located so as to face the to-be-inspected device which is loaded on the conductor layer and having the hole which has the shape corresponding to the spherical connection terminal. Thereby, by merely loading the to-be-inspected device on the positioning substrate so that the spherical connection terminal is inserted into the hole, the positioning between the spherical connection terminal and the connection portion can be performed. Thus, positioning between the spherical connection terminal and the connection portion can be performed easily and efficiently.

In the above-described twenty-fourth semiconductor inspection apparatus, fourth inspection method and fifth inspection method, the drawing mechanism for drawing the spherical connection terminal is provided to the positioning substrate. Thereby, the spherical connection terminal is drawn by the drawing mechanism and is inserted into the hole of the positioning substrate. Thus, because the spherical connection terminal is forcibly positioned in the hole by the drawing force which the drawing mechanism generates, the positioning process can be performed surely.

In the above-described twenty-fifth semiconductor inspection apparatus, the substrate positioning mechanism for performing the positioning between the hole and the connection portion is provided. Thereby, the positioning between the hole and connection portion can be performed with high accuracy. Accordingly, the positioning between the spherical connection terminal which is inserted into the hole and the connection portion can be performed with high accuracy.

In the above-described first inspection method, the spherical connection terminal is pressed to the connection portion formed in the conductor layer so that elastic deformation occurs in the connection portion of the conductor layer and the shock absorbing member. Thereby, the shape of the connection portion changes along the outer shape of the spherical connection terminal. Accordingly, the spherical connection terminal is prevented from being damaged by the connection terminal.

Further, as a result of the shape of the connection portion changing, the contact area between the connection portion and the spherical connection terminal increases. Accordingly, the electrical connection between the connection portion and the spherical connection terminal can be improved.

Further, the elastic restoring force occurring in the connection portion and the shock absorbing member due to the elastic deformation causes the connection portion to be pressed to the spherical connection terminal. Accordingly, a predetermined pressing force is always applied between the connection portion and the spherical connection terminal in the connected condition. Thus, electrical connection between the connection portion and the spherical connection terminal can be improved.

In the above-described second inspection method, merely by inserting the spherical connection terminal into the hole of the positioning substrate, the positioning of the spherical connection terminal can be performed. While maintaining the thus-positioned condition, the spherical connection terminal is electrically connected with the connection portion. Then, a test of the to-be-inspected apparatus is performed. Thereby, the connection portion and the spherical connection terminal can be connected with one another with good accuracy, and thus, the reliability of the inspection can be improved.

In the above-described third inspection method, at least one of the positioning substrate and the to-be-inspected device is vibrated and thus the spherical connection terminal is positioned in the hole of the positioning substrate. Thereby, the to-be-inspected device relatively moves on the positioning substrate, then, the spherical connection terminal is inserted into the hole of the positioning substrate, and thus, the spherical connection terminal is positioned. Thus, the positioning between the spherical connection terminal and the hole (that is, the positioning of the spherical connection terminal and the connection portion) can be performed easily and automatically.

Other objects and further features of the present invention will become more apparent from the following detailed description when read in conjunction with the accompanying drawings.

DETAILED DESCRIPTION OF THE PREFERRED EMBODIMENTS

Embodiments of the present invention will be described with reference to figures.

FIGS. 1A, 1B, 1C and 1D show a semiconductor inspection apparatus 10-1 in a first embodiment of the present invention and illustrate an inspection method using the apparatus. The semiconductor inspection apparatus 10-1 in the embodiment generally includes a conductor layer 11 and a shock absorbing member 12A.

Figure 1A:
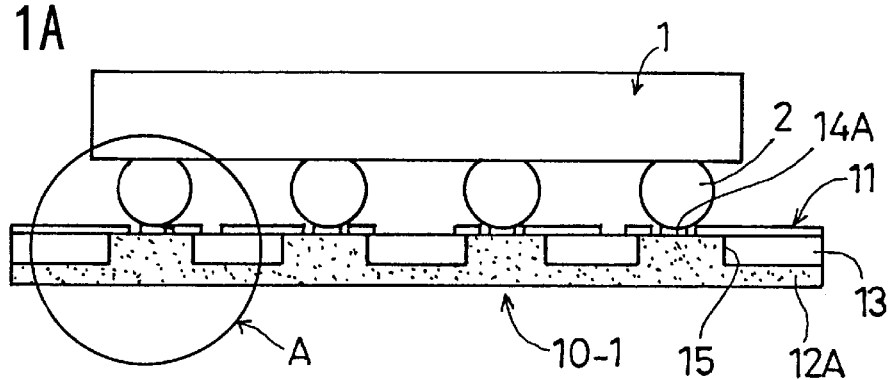
FIGS. 1A, 1B, 1C and 1D illustrate a semiconductor inspection apparatus in a first embodiment of the present invention and an inspection method using the apparatus.
Figure 1B:
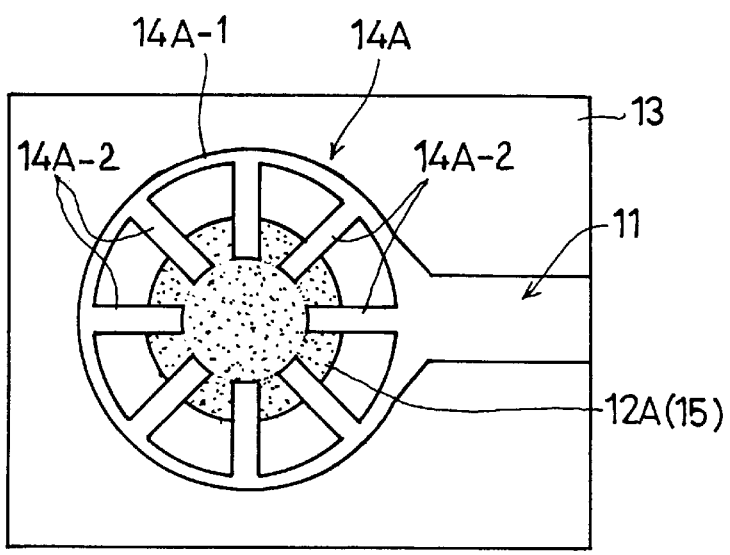
Figure 1C:
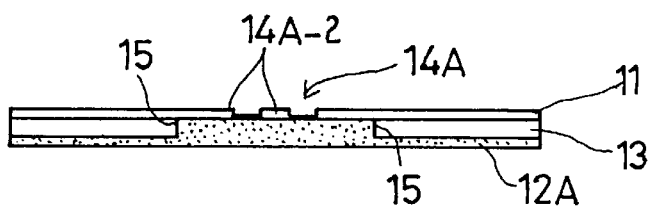
Figure 1D:
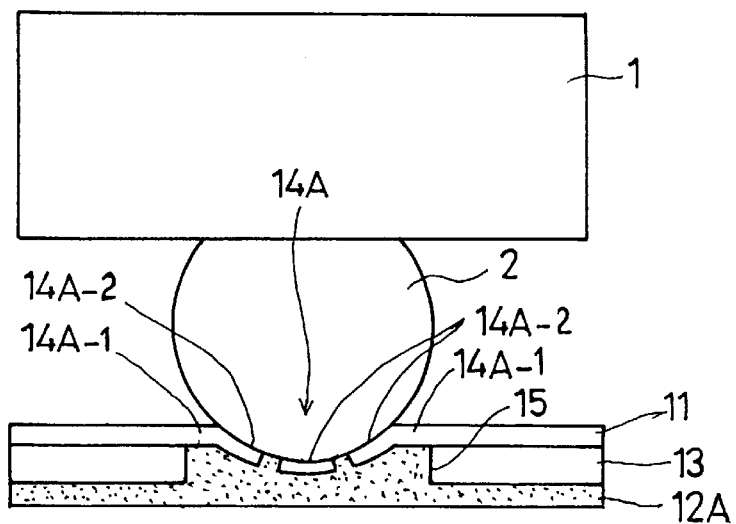

As shown in FIGS. 1A and 1D, a semiconductor device 1 is loaded on the semiconductor inspection apparatus 10-1. In this loaded condition, an electrical operation inspection of the to-be-inspected device is performed. The to-be-inspected device on which the semiconductor inspection apparatus 10-1 performs a test is a device which has spherical connection terminals such as bumps as external connection terminals.

Although the example in which the semiconductor device 1 having the spherical connection terminals 2 is used as the to-be-inspected device will be described, semiconductor inspection devices which will be described as respective embodiments can be used for various devices having the spherical connection terminals as external connection terminals.

A specific arrangement of the semiconductor inspection device 10-1 will now be described.

The conductor layer 11 is, for example, a copper (Cu) film and is formed on a supporting film 13 which is formed of an insulation resin material such as a polyimide or the like. These conductor layer 11 and supporting film 13 have the same structure as that of a flexible printed substrate (FPC). Accordingly, it is possible to obtain the conductor layer 11 and supporting film 13 in the embodiment using an FPC.

On a portion to which the spherical connection terminal 2 is connected, a connection portion 14A is formed. FIGS. 1B and 1C show magnified views of the portion indicated by the arrow A in FIG. 1A. FIG. 1B shows a plan view of this portion and FIG. 1C shows a sectional view of this portion. As shown in the respective figures, the connection portion 14A includes a ring-shaped portion 14A-1 and extending portions 14A-2. Further, in the position in which the connection portion 14A is formed, the supporting film 13 is not provided.

The ring-shaped portion 14A-1 has a diameter dimension such that the spherical connection terminal 2 can be inserted in the ring-shaped portion 14A-1. Further, the extending portions 14A-2 extend to a central portion from the ring-shaped portion 14A-1. The central end of each extending portion 14A-2 is a free end. Because the supporting film 13 is not provided in the position in which the connection portion 14A is formed, the shape of each extending portion 14A-2 can be easily changed.

Further, as shown in FIG. 1B, the extending portions 14A-2 extend from the central portion to the ring-shaped portion 14A-1 radially. Accordingly, when the spherical connection terminal 2 is inserted in the connection portion 14A, the extending portions 14A-2 can be surely connected with the spherical connection terminal 2.

The shock absorbing member 12A is formed of an insulating elastic member (for example, rubber, flexible resin or the like). When the semiconductor device 1 is loaded on the semiconductor inspection apparatus 10-1, the shock absorbing member 12A absorbs the shock of a pressing force of the spherical connection terminal 2. Further, when an unnecessary external force is applied, the shock absorbing member 12A absorbs the shock of the force.

Further, in the embodiment, a projecting portion 15 projecting to the connection portion 14A is formed in a portion of the shock absorbing member 12A which faces the connection portion 14A. Because the supporting film 13 is not provided in the position in which the connection portion 14A is formed, the projecting portion 15 projects in proximity to the bottom surface of the connection portion 14A.

As a result of the projecting portion 15 projecting to the connection portion 14A being formed in the shock absorbing member 12A, the distance between the connection portion 14A and the projecting portion 15 is small. Thereby, even if the shape of the connection portion (extending portions 14A-2) is changed as a result of an external force being applied, the connection portion 14A can be protected. Thus, the shape of the extending portions 14A-2 being excessively changed and thereby the extending portions 14A-2 being damaged can surely be prevented.

A method of performing inspection on the semiconductor device 1 using the above-described semiconductor inspection apparatus 10-1 will now be described.

In order to perform inspection on the semiconductor device 1, the spherical connection terminals 2 provided on the semiconductor device 1 and the connection portions 14A provided on the semiconductor inspection apparatus 10-1 are positioned. Then, the semiconductor device 1 is pressed onto the semiconductor inspection apparatus 10-1 and thus the spherical connection terminals 2 are connected with the connection portions 14A, respectively. A semiconductor inspection tester (not shown in the figures) is connected to the semiconductor inspection apparatus 10-1. Thereby, electrical operation inspection is performed on the semiconductor device 1 in the condition where the semiconductor device 1 has been loaded on the semiconductor inspection apparatus 10-1.

Thus, loading of the semiconductor device 1 on the semiconductor inspection apparatus 10-1 is very easy. Further, the shapes of the connection portions 14A (extending portion 14A-2), formed to the conductor layers 11, to which the spherical connection terminals 2 are connected, respectively, can be changed.

Accordingly, in the condition where the semiconductor device 1 has been loaded on the semiconductor inspection apparatus 10-1, as shown in FIG. 1D, the shapes of the extending portions 14A-2 change along the outer shape of the spherical connection terminal 2, respectively. Thereby, the contact areas between the connection portion 14A and the spherical connection terminal 2 increases, and, thus, electrical connection therebetween can be ensured.

In order to enable change of the shapes of the connection portions 14A, it is necessary to form the conductor layer 11 to be thin. Thereby, the mechanical strength of the conductor layers 11 may be degraded. However, because the conductor layers 11 (except the connection portions 14A) are supported on the supporting film 13, the mechanical strength of the conductor layers 11 is maintained.

For the connection portions 14A, the supporting film 13 is not provided so that improved electrical connection with the spherical connection terminals 2 can be provided. Because the supporting film 13 is not provided for the connection portions 14A, the mechanical strength of the connection portions 14A would normally be degraded. However, in the embodiment, as mentioned above, the connection portions 14A are supported by the projecting portions 15 which are formed to the shock absorbing member 12A. Thereby, it is possible to prevent permanent deformation of the connection portions 14A. As a result, stable inspection can be always performed.

A second embodiment of the present invention will now be described.

Figure 2A:
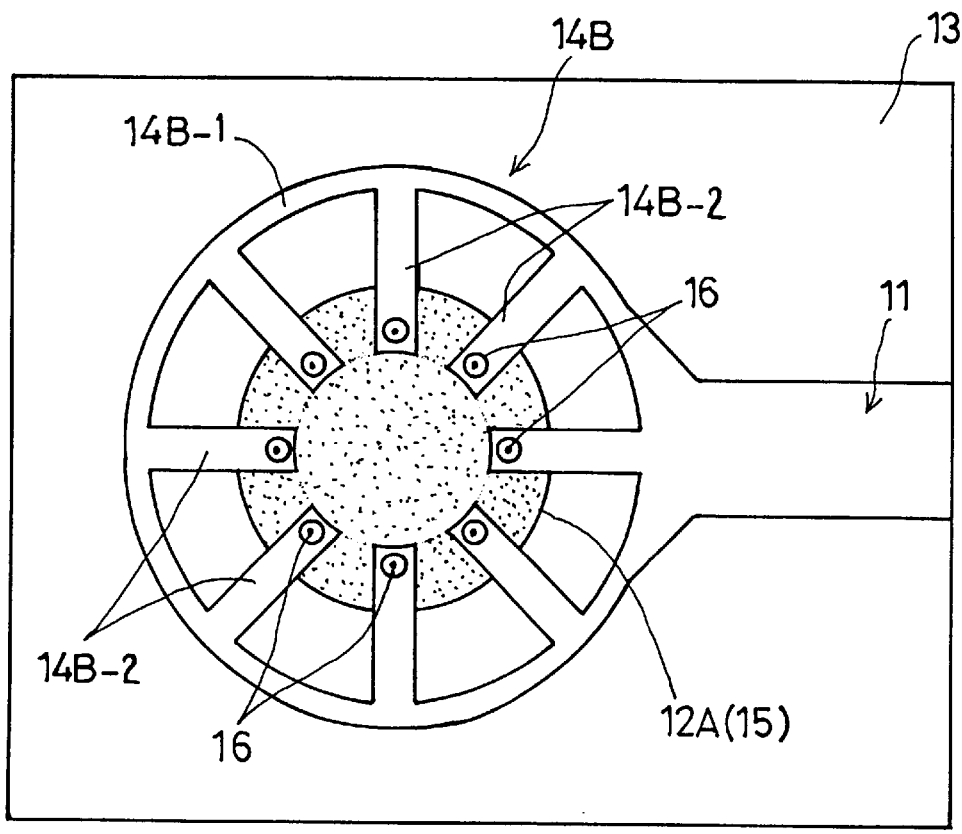
FIGS. 2A and 2B illustrate a semiconductor inspection apparatus in a second embodiment of the present invention.
Figure 2B:
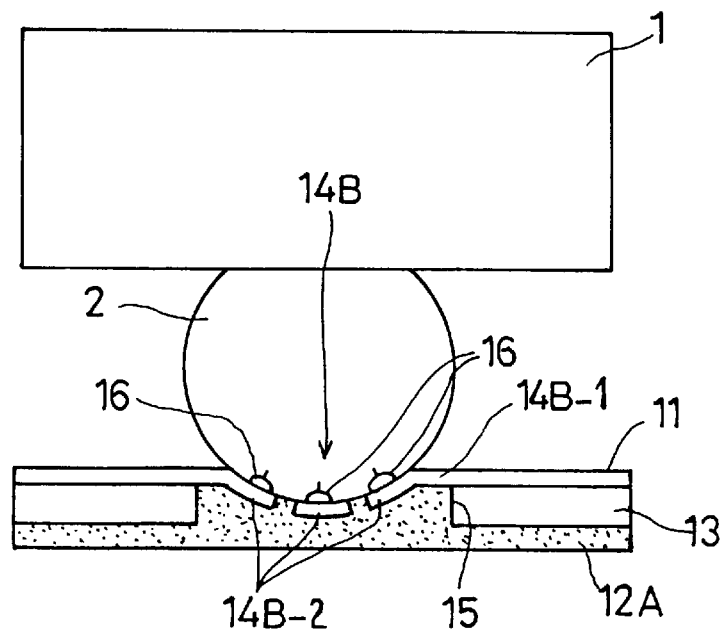

FIGS. 2A and 2B show magnified views of a connection portion 14B of a semiconductor inspection apparatus in the second embodiment. For each embodiment which will be described, the same reference numerals are given to the same portions as those of the semiconductor inspection apparatus 10-1 in the first embodiment shown in FIGS. 1A, 1B, 1C and 1D, and descriptions thereof will be omitted.

In the second embodiment, stud bumps 16 are formed on extending end portions of extending portions 14B-2, respectively, formed in the connection portion 14B. The stud bumps 16 are formed, for example, using the wire bonding method. When each stud bump 16 is formed in the wire bonding method, a so-called nail head portion is formed on the extending end portion of the extending portion 14B-2 using a capillary provided to a wire bonding apparatus. Then, after slightly moving the capillary upward, the wire is cut. By such a simple process, each stud bump 16 is formed.

As a result of the stud bumps 16 being formed on the extending end portions of the extending portions 14B-2, respectively, the extending end portions of the extending portions 14B-2 project upward. When, as shown in FIG. 2B, the spherical connection terminal 2 is connected with the extending portions 14B-2, the stud bumps 16 projecting from the extending end portions of the extending portions 14B-2 are connected with the spherical connection terminals 2. At this connection, the stud bumps 16 dig into the spherical connection terminal 2. Thereby, the connection portion 14B is protected, and, also, improved electrical connection between the connection portion 14B and the spherical connection terminal 2 can be provided. For the sake of illustration, the stud bumps 16 are large in the figures. However, actually, the stud bumps 16 are so small that the spherical connection terminal 2 is not damaged although the stud bumps 16 dig into the spherical connection terminal 2.

As described above, the stud bumps 16 can be formed using the wire bonding technique which is generally used as a semiconductor device manufacturing technique. Accordingly, the stud bumps 16 can be formed at a low cost and efficiently. Further, generally, each stud bump 16 has a small projection which is formed by the wire cutting at the projecting end thereof and the small projection is pointed. Thereby, further improved electrical connection between the connection portion 14B (stud bumps 16) and the spherical connection terminals 2 can be provided.

Figure 3A:
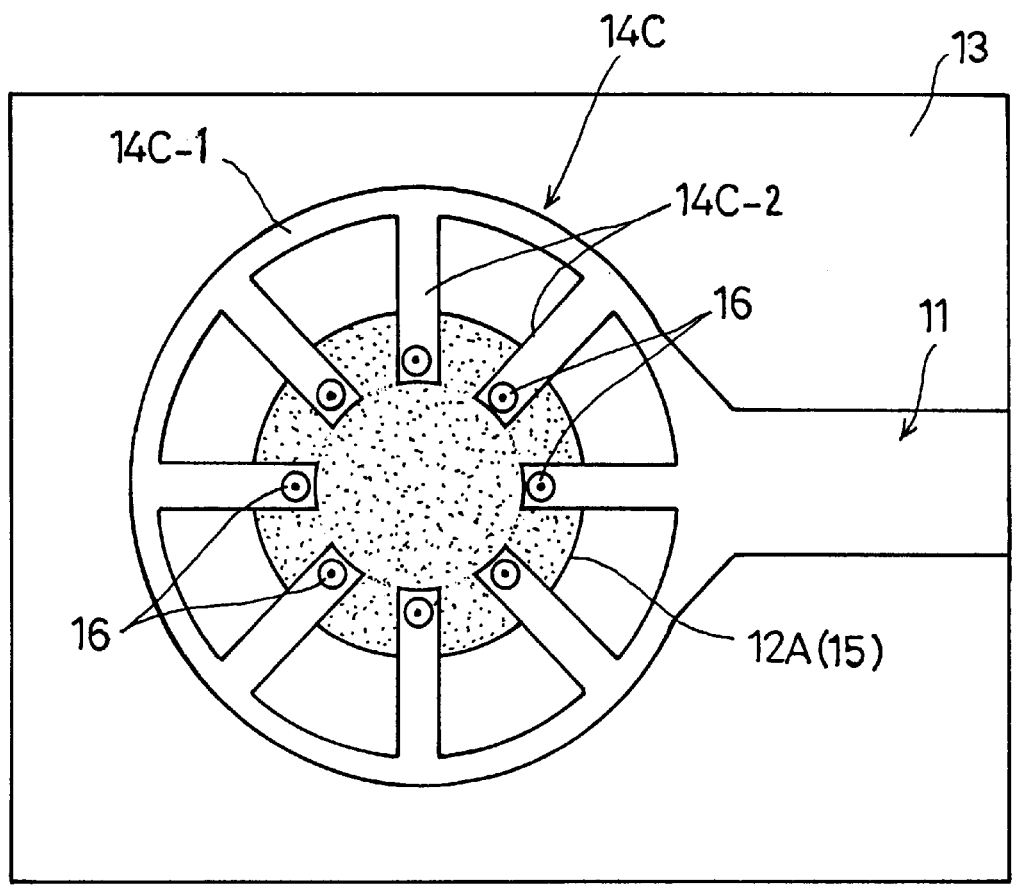
FIGS. 3A and 3B illustrate a semiconductor inspection apparatus in a first variant example of the second embodiment.
Figure 3B:
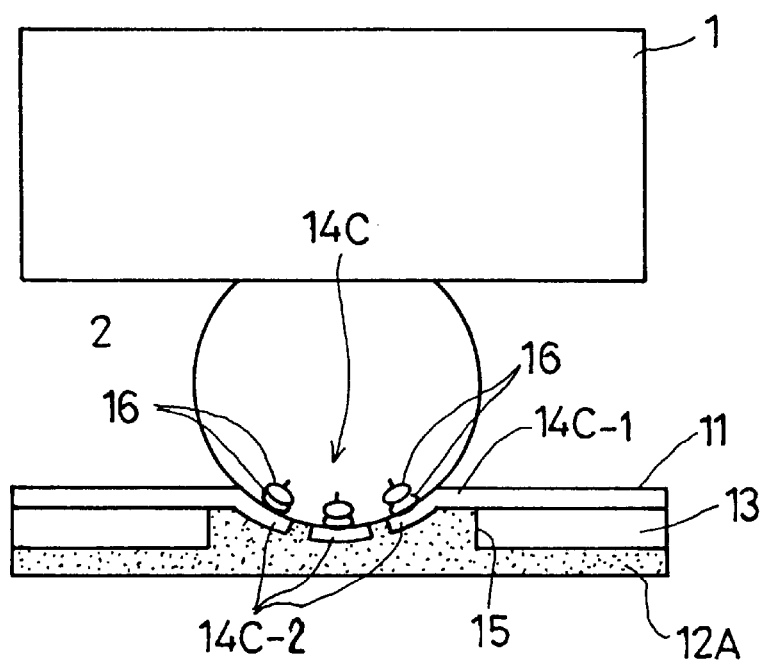

FIGS. 3A and 3B show magnified views of a connection portion 14C of a semiconductor inspection apparatus in a first variant example of the above-described second embodiment. In this variant example, a plurality (two, in this example) of stud bumps 16 are stacked.

Stacking a plurality of stud bumps 16 as shown in FIG. 3B is possible and, by stacking a plurality of stud bumps 16, the projection height of the entire stud bump 16 can be increased. Thereby, it is possible to provide the stud bump 16 of the height which is suitable for the diameter dimension and so forth of the spherical connection terminal 2. Thus, further improved electrical connection between the spherical connection terminal 2 and the connection portion 14C can be provided.

Figure 4A:
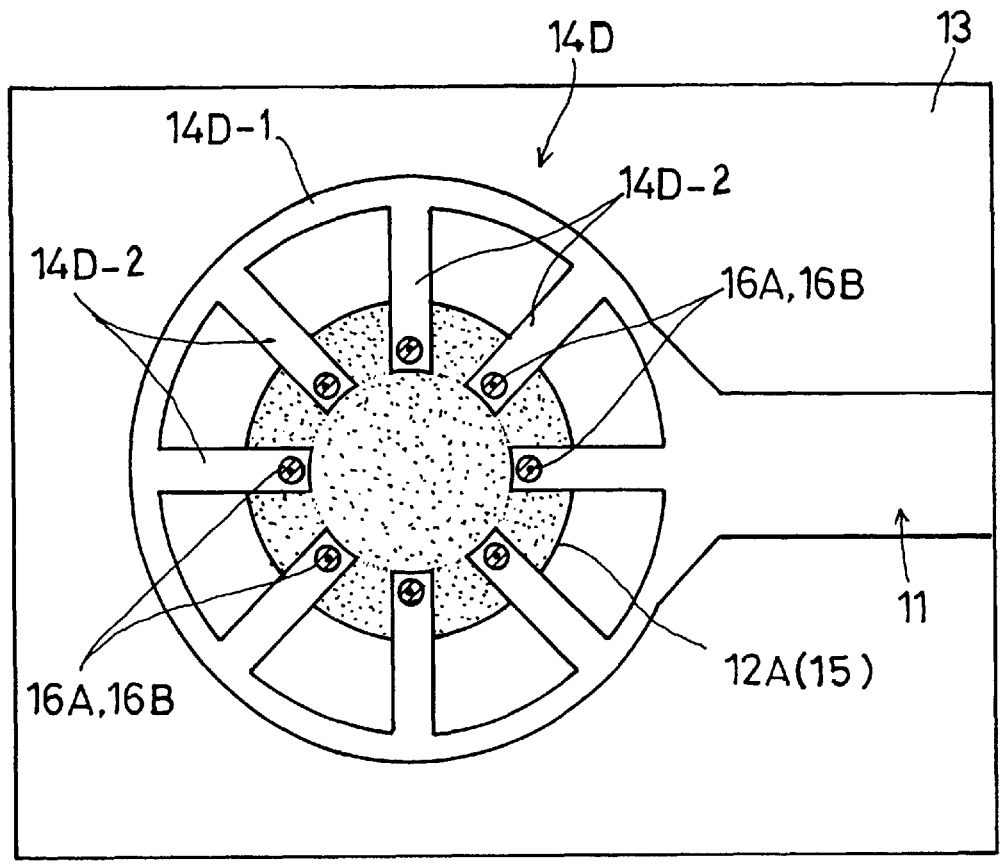
FIGS. 4A and 4B illustrate a semiconductor inspection apparatus in a second variant example of the second embodiment.
Figure 4B:
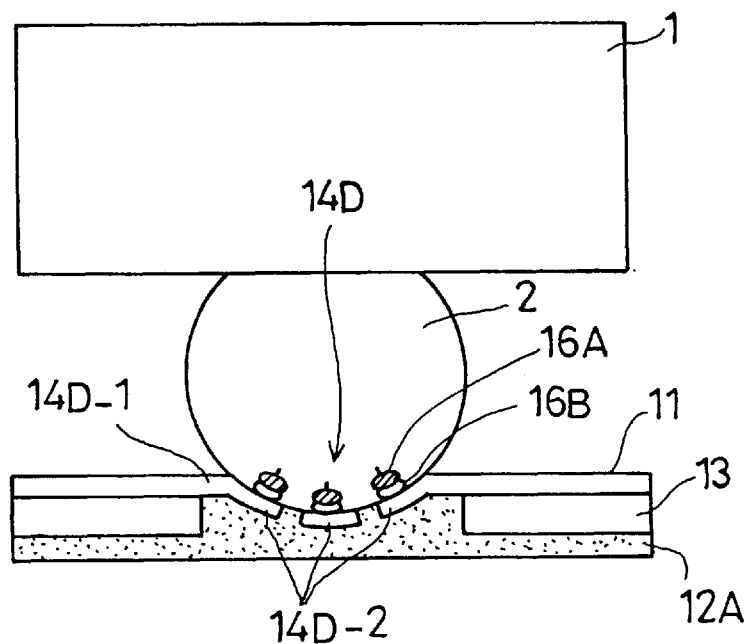

FIGS. 4A and 4B show magnified views of a connection portion 14D of a semiconductor inspection apparatus in a second variant example of the above-described second embodiment. In this variant example, a plurality (two, in this example) of stud bumps 16A and 16B of different kinds of metals are stacked.

In this variant example, the stud bumps 16A and 16B are stacked to form a two-layer structure. The material of the projecting-end-portion stud bump 16A is palladium (Pd) and the material of the lower stud bump 16B is gold (Au).

The reason why the material of the projecting-end-portion stud bump 16A is palladium (Pd) is that, generally, the spherical connection terminal 2 is plated with solder, and the compatibility between the solder and the palladium is good. The reason why the material of the lower stud bump 16B is gold (Au) is that the material of the connection portion 14D is copper (Cu), the compatibility between the copper and the gold is good, and, also, the compatibility between the gold and the palladium of the projecting-end-portion stud bump 16A is good.

Thus, by forming the multistage plurality of stud bumps 16A, 16B of the different kinds of metals, the material of the projecting-end-portion stud bump 16A can be selected so that the compatibility between the material of the projecting-end-portion stud bump 16A and the material of the spherical connection terminal 2 can be good. Also, the material of the other stud bump 16B can be selected so that the compatibility between the material of the stud bump 16B and the material of the connection portion 14D can be good, and, also, the compatibility between the material of the stud bump 16B and the material of the projecting-end-portion stud bump 16A can be good.

Thus, the connection between the projecting-end-portion stud bump 16A and the spherical connection terminal 2 can be good connection, the connection between the projecting-end-portion stud bump 16A and the other stud bump 16B can be a good connection, and the connection between the stud bump 16B and the connection portion 14D can be a good connection. Further, in a case where the lower stud bump 16B includes a plurality of stacked stud bumps 16B, the connection between each pair of adjacent stud bumps 16B of the plurality of stacked stud bumps 16B can be a good connection.

A third embodiment of the present invention will now be described.

Figure 5A:
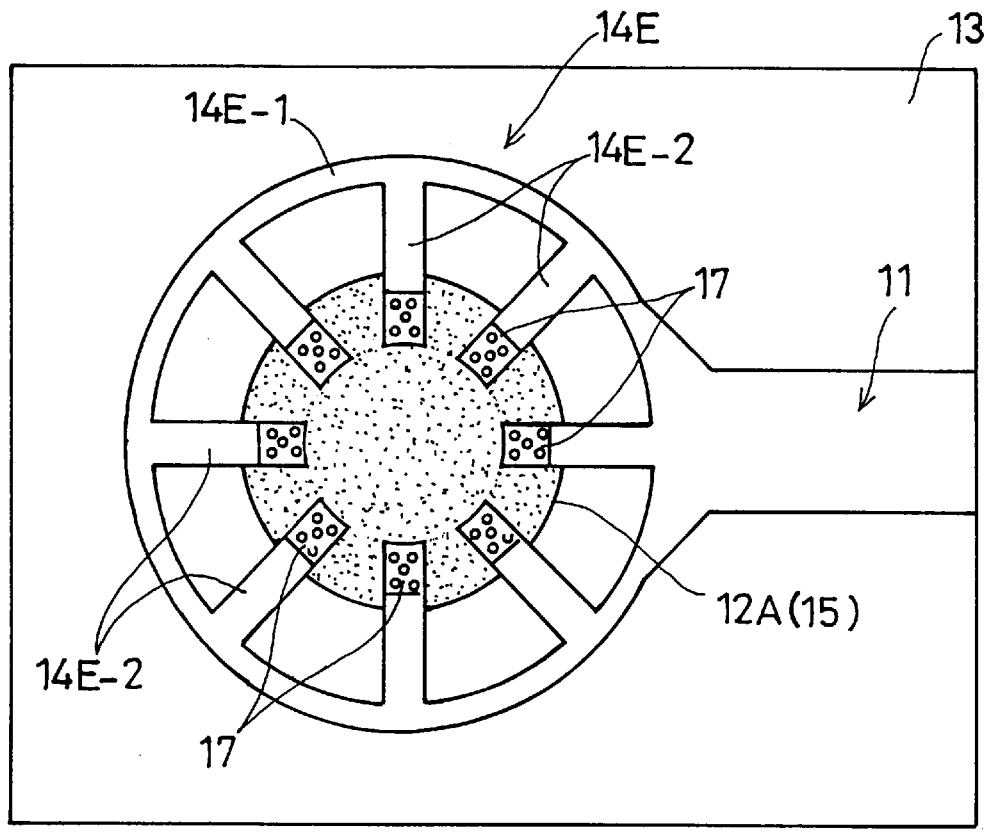
FIGS. 5A and 5B illustrate a semiconductor 10 inspection apparatus in a third embodiment of the present invention.
Figure 5B:
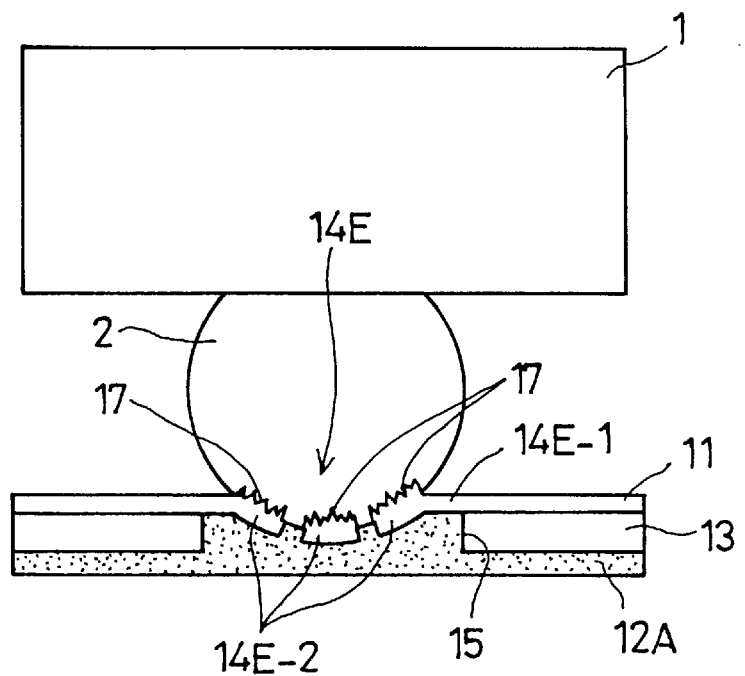

FIGS. 5A and 5B show magnified views of a connection portion 14E of a semiconductor inspection apparatus in the third embodiment of the present invention. In this embodiment, roughened surfaces 17 are formed on extending portions 14E-2, respectively, which are formed in the connection portion 14E.

The roughened surfaces 17 are formed by performing blasting working or chemical working (for example, immersion in strong acid) on the surfaces of the extending portions 14E-2. The thus-formed roughened surfaces 17 have minute unevenness thereon, and thus, the surface areas thereof are substantially large. When the spherical connection terminal 2 comes into contact with the connection portion 14E, the minute projections of the roughened surfaces 17 dig into the spherical connection terminal 2. Thereby, electrical connection between the connection portion 14E (extending portions 14E-2) and the spherical connection terminal 2 can be ensured.

A fourth embodiment of the present invention will now be described.

Figure 6A:
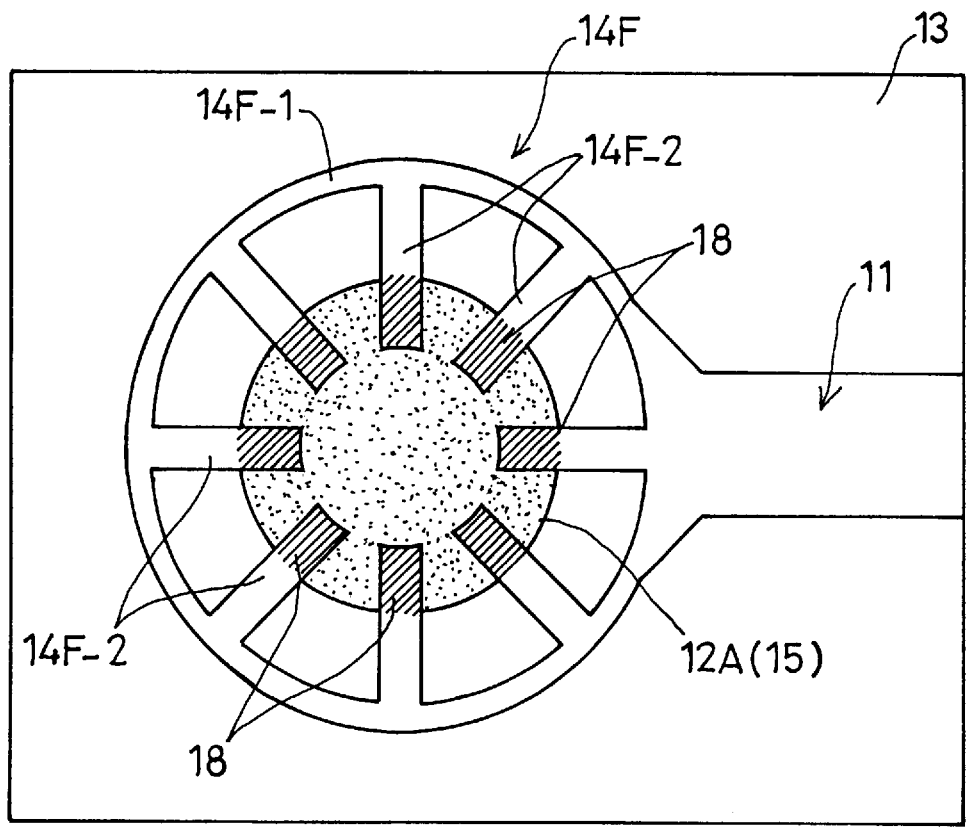
FIGS. 6A and 6B illustrate a semiconductor inspection apparatus in a fourth embodiment of the present invention.
Figure 6B:
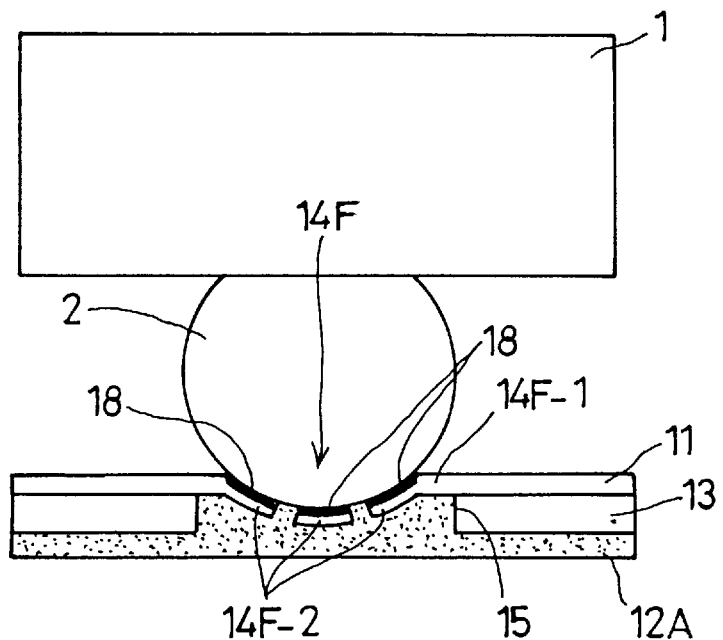

FIGS. 6A and 6B show magnified views of a connection portion 14F of a semiconductor inspection apparatus in the fourth embodiment of the present invention. In this embodiment, a different kind of metal film 18 is formed on a surface of each extending portion 14F-2, which is formed in the connection portion 14F.

The different kind of metal film 18 is a metal film, the material of which is different from the material of the connection portion 14F. Specifically, the material of the connection portion 14F is copper (Cu). The material of the different kind of metal film 18 is different from the material of the connection portion 14F, and, for example, nickel (Ni) or palladium (Pd) is selected as the material of the different kind of metal film 18.

The reason why nickel (Ni) or palladium (Pd) is selected as the material of the different kind of metal film 18 will now be described. Generally, the spherical connection terminal 2 is plated with solder, and the compatibility between the solder and any one of nickel and palladium is good. Also, the material of the connection portion 14F is copper (Cu), and the compatibility between the copper and any one of nickel and palladium is good.

Thus the different kind of metal film 18 is formed on the surface of each extending portion 14F-2, the compatibility between the different kind of metal film 18 and the connection portion 14F being good, and, also, the compatibility between the different kind of metal film 18 and the spherical connection terminal 2 being good. Thereby, even if the direct connection between the connection portion 14F and the spherical connection terminal 2 is not a good connection, the connection between the connection portion 14F (extending portions 14F-2) and the spherical connection terminal 2 can be a good electrical connection, by inserting the different kind metal of film 18 between the connection portion 14F and the spherical connection terminal 2.

Further, the surfaces of the extending portions 14F-2, on which the spherical connection terminal 2 slides when the semiconductor device 1 is loaded, are covered by the different kind of metal film 18. Thereby, the connection portion 14F can be protected.

Figure 7A:
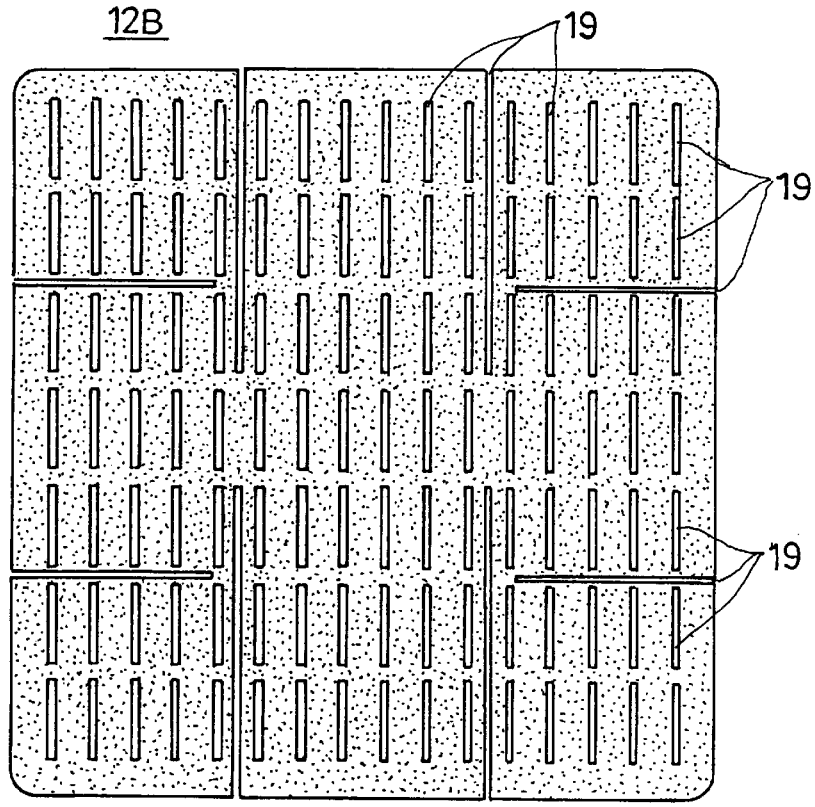
FIGS. 7A and 7B illustrate a variant example of a shock absorbing member.
Figure 7B:
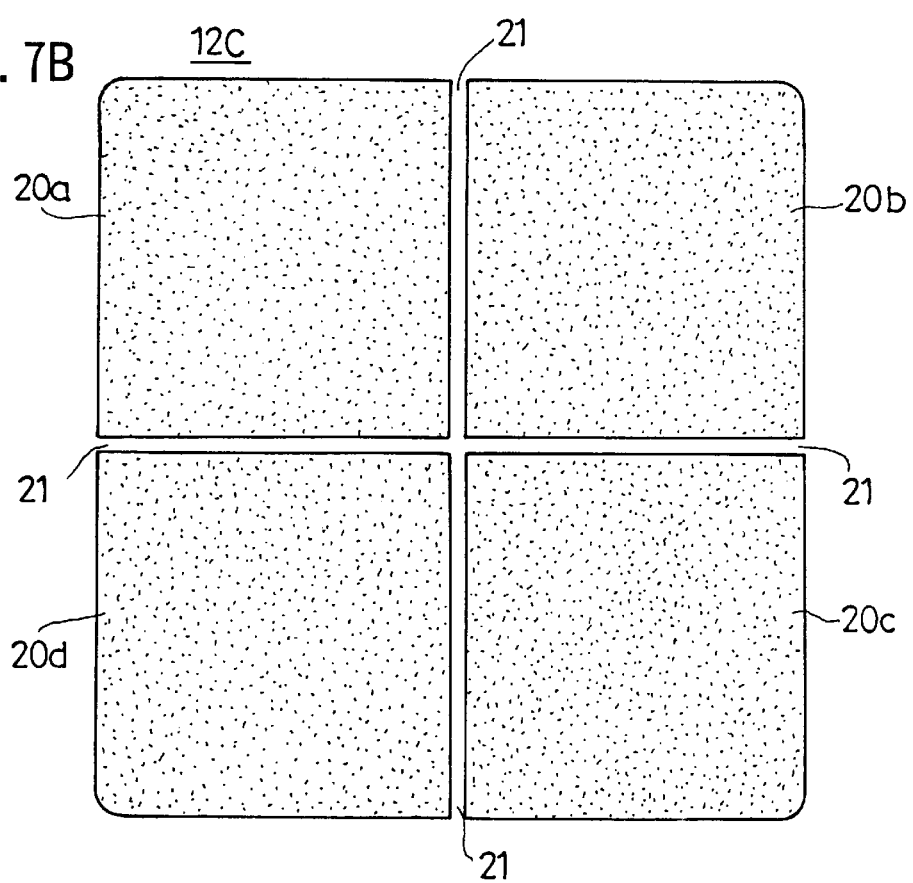

FIGS. 7A and 7B show variant examples of the above-mentioned shock absorbing member 12A.

The shock absorbing member 12A provided in the semiconductor inspection apparatus 10-1 is a simple plane-plate-shaped member except that the above-mentioned projecting portions 15 are formed.

In contrast to this, in the variant example shown in FIG. 7A, many cut portions 19 are formed in a shock absorbing member 12B. In the variant example shown in FIG. 7B, a shock absorbing member 12C is a combination of a plurality of division members 20a, 20b, 20c and 20d.

By forming the cut portions 19 in the shock absorbing member 12B, the elasticity of the shock absorbing member 12B increases. By forming the shock absorbing member 12C to be the combination of the plurality (4 sheets in this example) of division members 20a, 20b, 20c and 20d, the elasticity of the shock absorbing member 12C increases. In the case of the shock absorbing member 12B, by providing the cut portions 19, when an external force is applied, the sizes of the cut portions 19 change. Accordingly, the rigidity of the shock absorbing member 12B can be decreased.

In the case of the shock absorbing member 12C, by combining the division members 20a, 20b, 20c and 20d, gap portions 21 are formed in between each pair of adjacent ones of the division members 20a, 20b, 20c and 20d. The function of the gap portions 21 is similar to the function of the cut portions 19 of the shock absorbing member 12B. Thus, the shock absorbing function of the shock absorbing member 12B increases and the shock absorbing function of the shock absorbing member 12C increases. Thereby, protection of the connection portions 14A, 14B, 14C, 14D, 14E and 14F can be ensured.

Figure 8A:
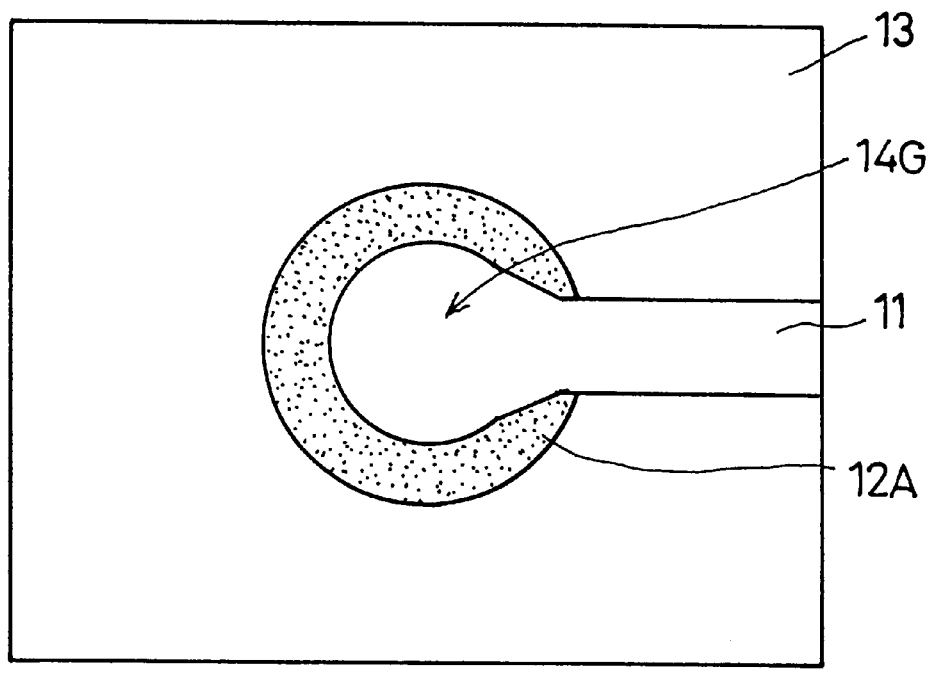
FIGS. 8A and 8B show arrangement examples of connection portions.
Figure 8B:
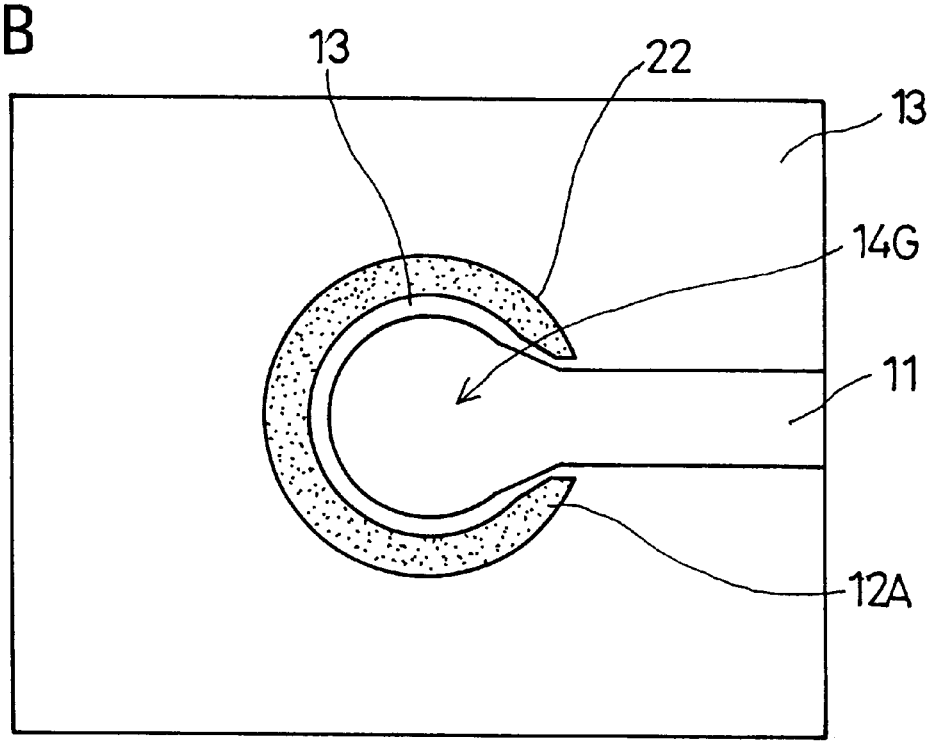

FIGS. 8A and 8B show variant examples of the above-mentioned connection portions 14A, 14B, 14C, 14D, 14E and 14F.

The connection portions 14A, 14B, 14C, 14D, 14E and 14F described in the respective embodiments include the ring-shaped portions 14A-1, 14B-1, 14C-1, 14D-1, 14E-1 and 14F-1 and the extending portions 14A-2, 14B-2, 14C-2, 14D-2, 14E-2 and 14F-2, respectively. In contrast to these, in the variant examples shown in FIGS. 8A and 8B, the shape of a connection portion 14G is a nail head shape.

Specifically, in the variant example shown in FIG. 8A, the shape of the connection portion 14G is the nail head shape, and also, the supporting film 13 is not provided underneath the connection portion 14G. In the variant example shown in FIG. 8B, the shape of the connection portion 14G is the nail head shape, and also, a ring-shaped groove 22 surrounding the connection portion 14G is formed in the supporting film 13 and the supporting film 13 is present underneath the connection portion 14G. In the arrangement shown in FIG. 8B, although the supporting film 13 is present underneath the connection portion 14G, the shape of the connection portion 14G can change because the ring-shaped groove 22 is provided.

By forming the connection portion 14G to have the nail head shape as mentioned above, the connection portion 14G is supported like a cantilever. Accordingly, the shape of the connection portion 14G easily changes as a result of the spherical connection terminal 2 being loaded thereon. Thus, connection between the connection portion 14G and the spherical connection terminal 2 can be surely performed with a weak pressing force. Further, in comparison to the above-mentioned connection portions 14A, 14B, 14C, 14D, 14E and 14F, durability can be improved and the connection portion 14G can be easily formed.

A fifth embodiment and a sixth embodiment of the present invention will now be described.

Figure 9A:
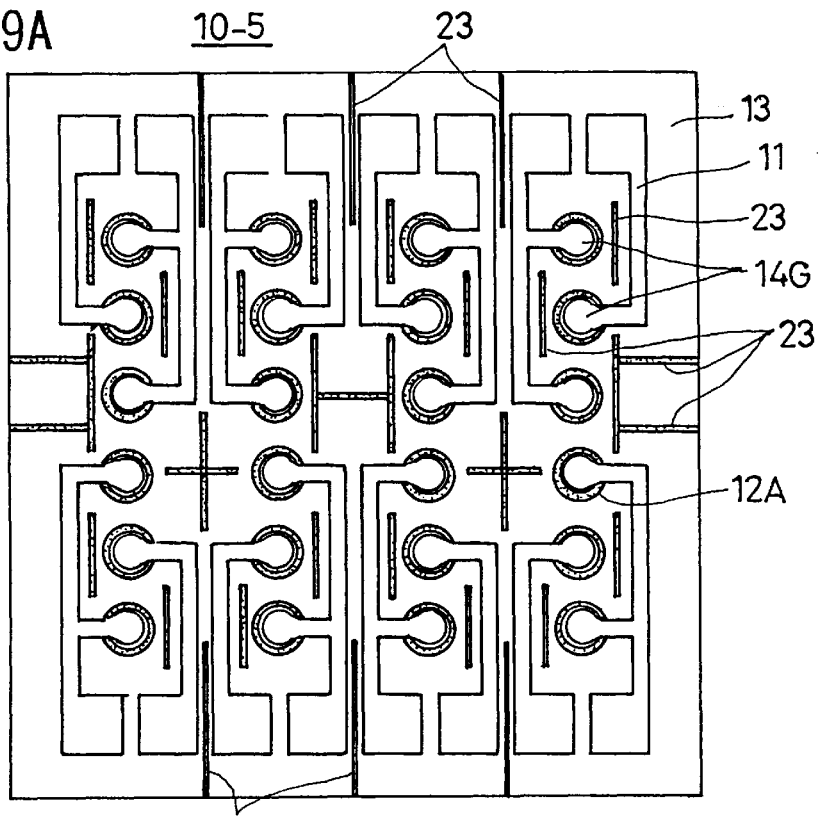
FIGS. 9A and 9B illustrate semiconductor inspection apparatuses in fifth and sixth embodiments of the present invention.
Figure 9B:
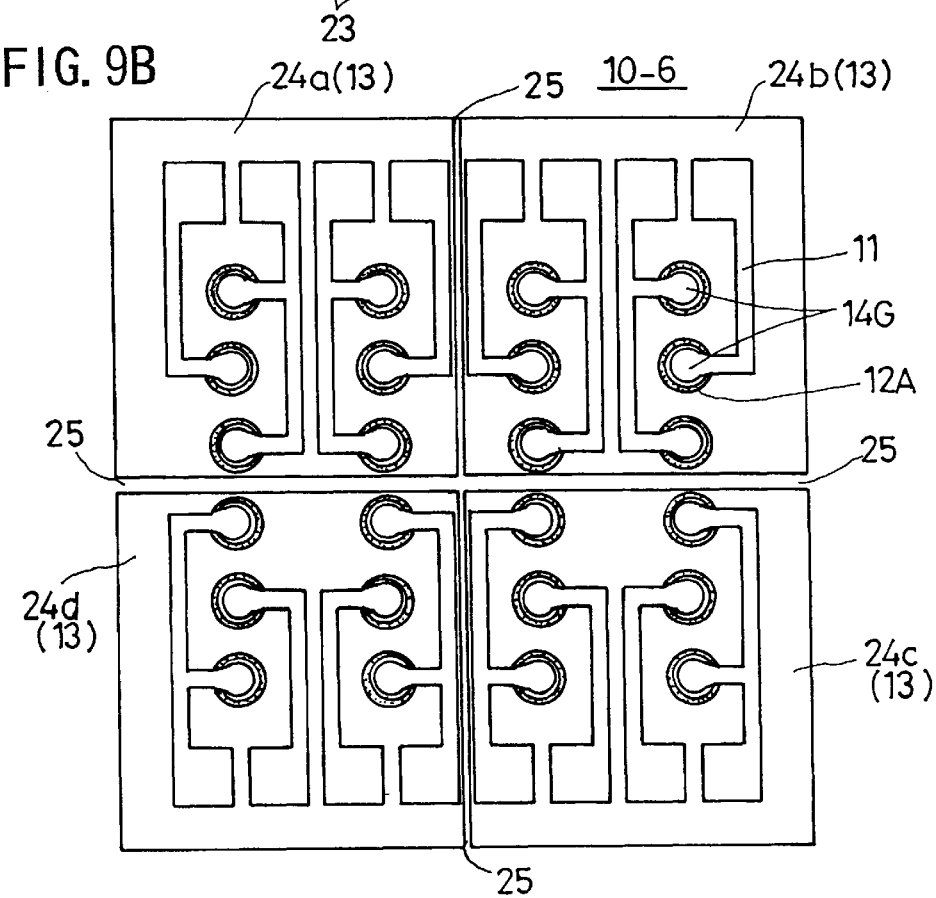

FIG. 9A shows a plan view of a semiconductor inspection apparatus 10-5 in the fifth embodiment of the present invention, and FIG. 9B shows a plan view of a semiconductor inspection apparatus 10-6 in the sixth embodiment of the present invention.

In the semiconductor inspection apparatus 10-5 shown in FIG. 9A, cut portions 23 are formed in the supporting film 13. In the semiconductor inspection apparatus 10-6 shown in FIG. 9B, the supporting film 13 is a combination of a plurality (four sheets in this embodiment) of division film members 24a, 24b, 24c and 24d.

As a result of the cut portions 23 being formed in the supporting film 13 as shown in FIG. 9A, the supporting film 13 can have elasticity. As a result of combining the plurality of division film members 24a, 24b, 24c and 24d to form the supporting film 13 as shown in FIG. 9B, gap portions 25 can be formed between each adjacent ones of the division film members.

Thereby, various stresses, which occur when the semiconductor device 1 is loaded, can be absorbed as a result of change of the sizes of the cutting portions 23 or as a result of moving of the division film members 24a, 24b, 24c and 24d in the gap portions 25. The above-mentioned various stresses may include, for example, the stress occurring as a result of the spherical connection terminal 2 pressing the connection portions 14G (14A, 14B, 14C, 14D, 14E and 14F), and the thermal stress occurring as a result of the semiconductor device 1 generating heat.

Thereby, it is possible to prevent unnecessary stresses from being applied to the position at which the spherical connection terminal 2 comes into contact with the connection portion 14G (14A, 14B, 14C, 14D, 14E and 14F). Thereby, a good connection condition between the spherical connection terminal 2 and the connection portion 14G (14A, 14B, 14C, 14D, 14E and 14F) can be maintained.

A seventh embodiment and an eighth embodiment of the present invention will now be described.

Figure 10:
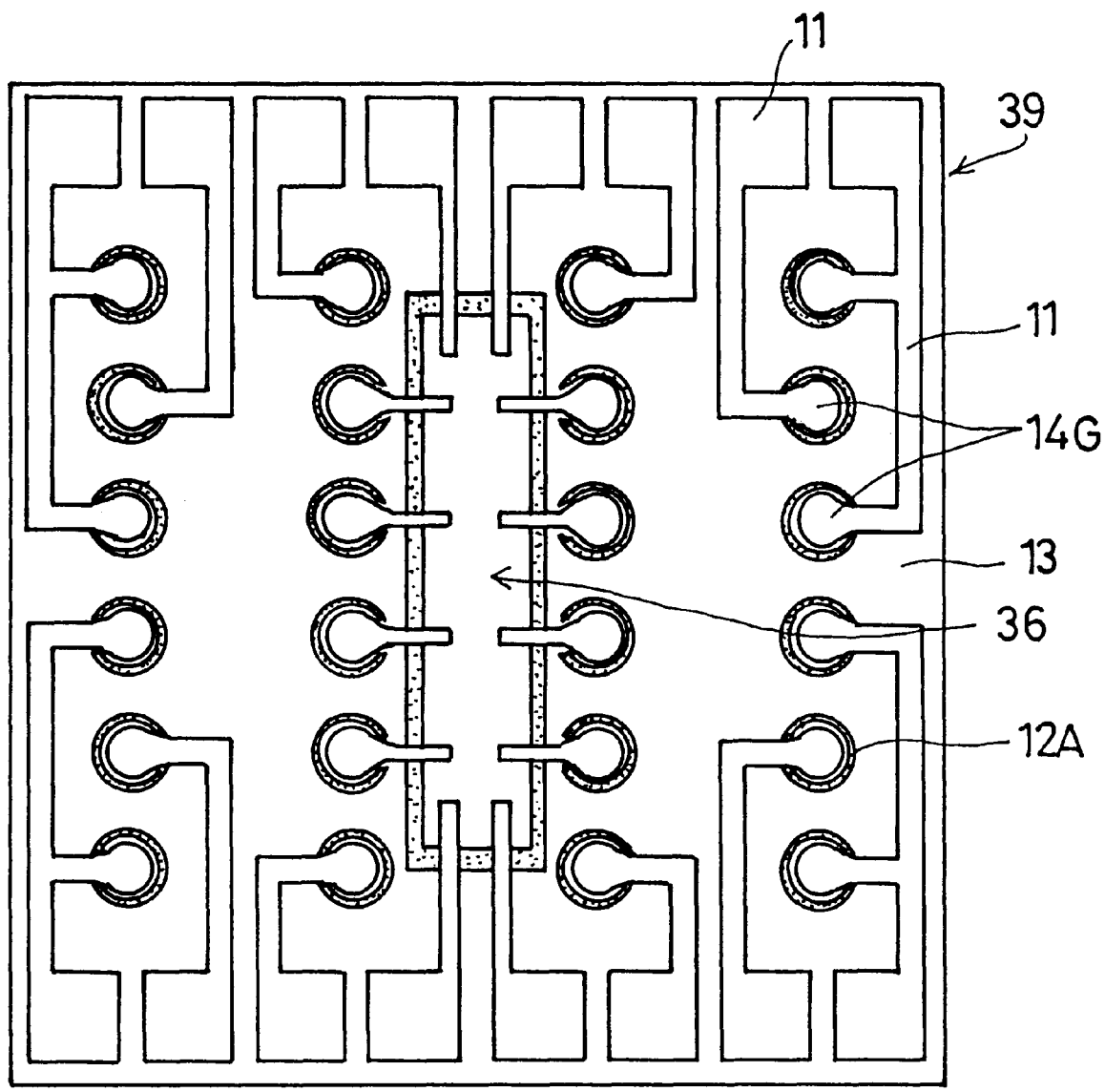
FIG. 10 illustrates a semiconductor inspection apparatus in a seventh embodiment of the present invention.
Figure 11:
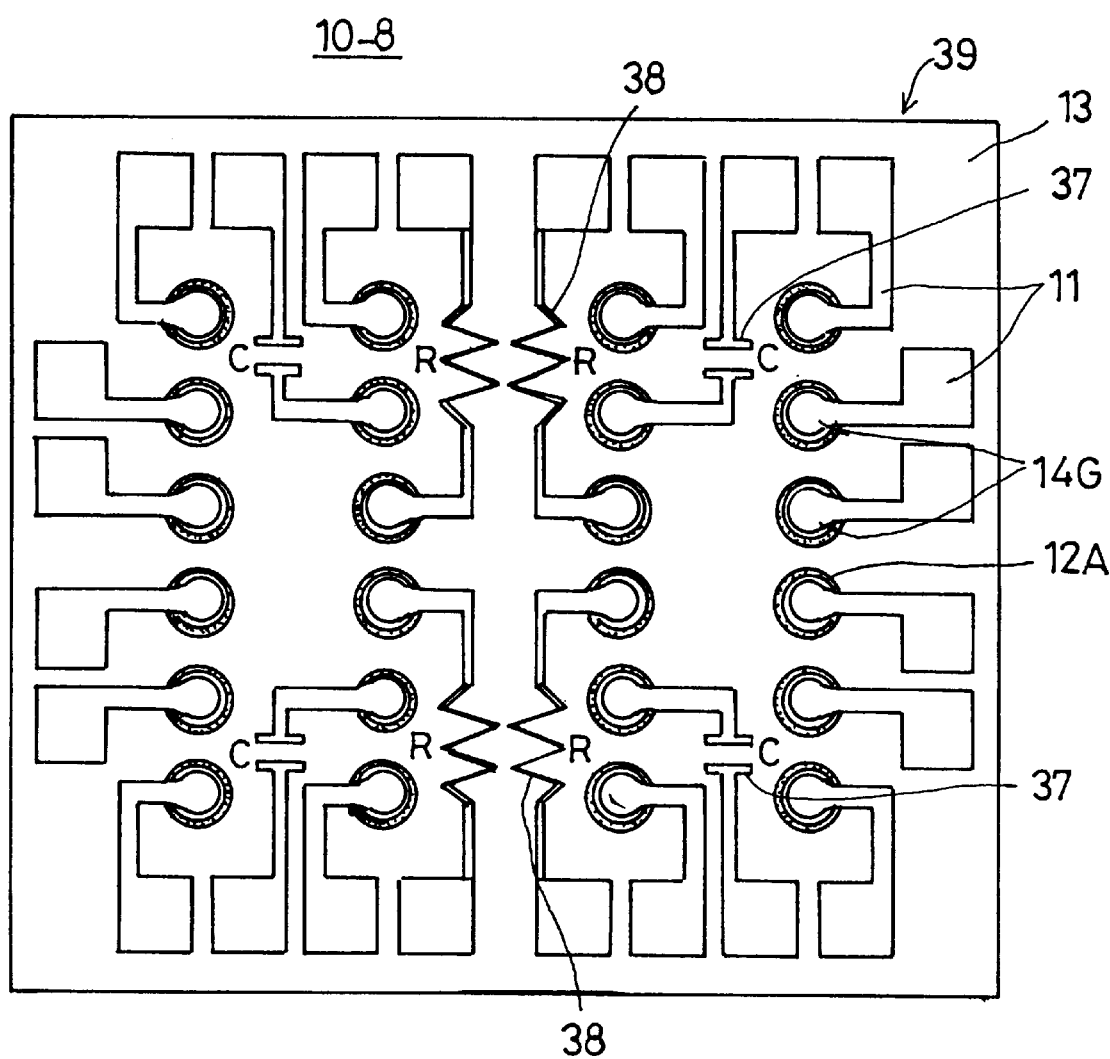
FIG. 11 illustrates a semiconductor inspection apparatus in an eighth embodiment of the present invention.

FIG. 10 shows a plan view of a semiconductor inspection apparatus 10-7 in the seventh embodiment of the present invention, and FIG. 11 shows a plan view of a semiconductor inspection apparatus 10-8 in the eighth embodiment of the present invention. In the semiconductor inspection apparatuses 10-7 and 10-8 in the seventh and eighth embodiments, electronic devices 36, 37 and 38, which are connected with the conductor layers 11, are provided on a substrate 39 which includes the conductor layers 11 and the supporting film 13.

In the semiconductor inspection apparatus 10-7 shown in FIG. 10, a semiconductor device 36 (IC) is provided and the IC 36 and the conductor layers 11 are electrically connected with each other. In the semiconductor inspection apparatus 10-8 shown in FIG. 11, capacitors 37 and resisters 38 are formed on the substrate 39, and these are electrically connected with the conductor layers 11.

As a result of the electronic devices 36, 37 and 38 being provided on the substrates 39 (conductor layers 11 and supporting films 13) to form the semiconductor inspection apparatuses 10-7 and 10-8, respectively, impedance matching or inductance matching can easily be performed. Thereby, accuracy errors due to the semiconductor inspection apparatuses 10-7 and 10-8 can be restrained from occurring, and thus, high-accuracy semiconductor inspection can be performed.

Further, as a result of the IC 36, which functions as an active device, being provided on the semiconductor inspection apparatus 10-7, it is possible that the semiconductor inspection apparatus 10-7 itself performs part or all of semiconductor inspection processes. Thereby, it is possible to reduce inspection processes which a semiconductor inspection tester performs.

A ninth embodiment of the present invention will now be described.

Figure 12:
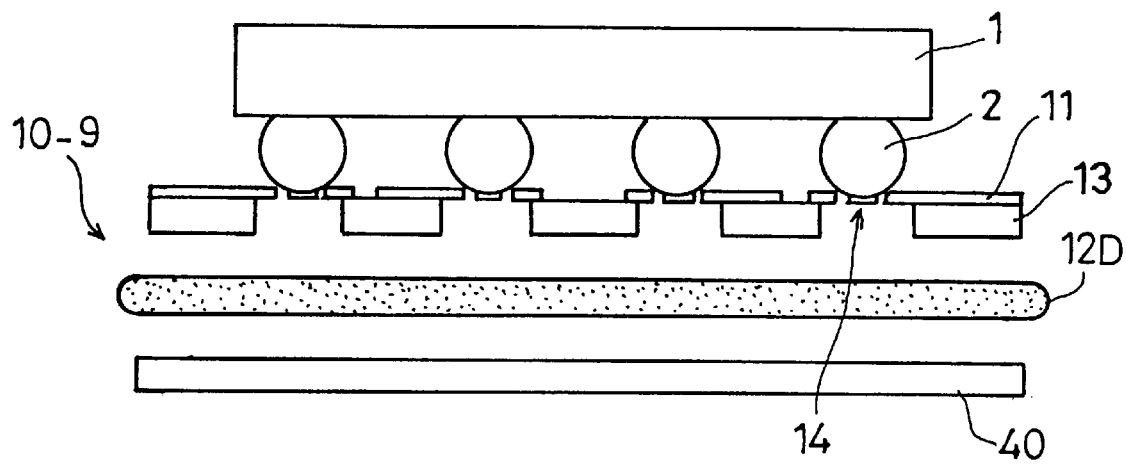
FIG. 12 illustrates a semiconductor inspection apparatus in a ninth embodiment of the present invention.

FIG. 12 shows an exploded view of a semiconductor inspection apparatus 10-9 in the ninth embodiment. As shown in the figure, in the semiconductor inspection apparatus 10-9 in this embodiment, a supporting member 40 is provided underneath a shock absorbing member 12D. The supporting member 40 is formed of a material having a low elastic deformation rate such as a metal, hard resin or the like.

Further, in the embodiment shown in FIG. 12, each of the supporting member 40 and the shock absorbing member 12D has a flat shape. The supporting member 40 is provided underneath the shock absorbing member 12D and thereby supports the shock absorbing member 12D.

As a result of the supporting member 40 which supports the shock absorbing member 12D being provided, the supporting member 40 can support the shock absorbing member 12D, the shape of which elastically changes as a result of the semiconductor device 1 being loaded. Thereby, an unnecessary change of the shape of the shock absorbing member 12D can be prevented, and shifting of the shock absorbing member 12D from a predetermined position can be prevented. Thereby, the connection between the connection portion 14A, 14B, 14C, 14D, 14E, 14F or 14G (hereinafter, in a case where each of the connection portion 14A, 14B, 14C, 14D, 14E, 14F and 14G can be applied, simply referred to as the connection portion 14) can be always performed in a stable condition.

A tenth embodiment and an eleventh embodiment of the present invention will now be described.

Figure 13:
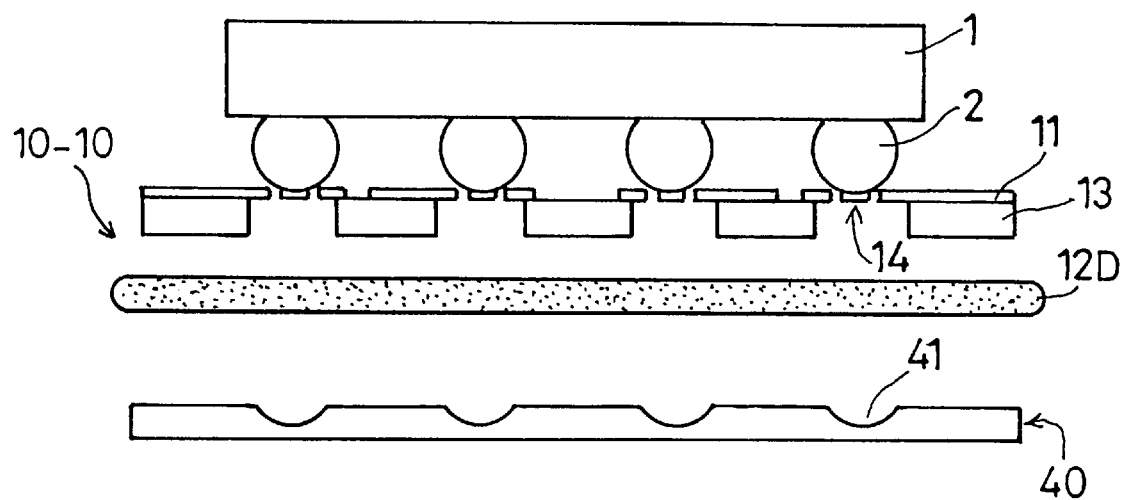
FIG. 13 illustrates a semiconductor inspection apparatus in a tenth embodiment of the present invention.
Figure 14:
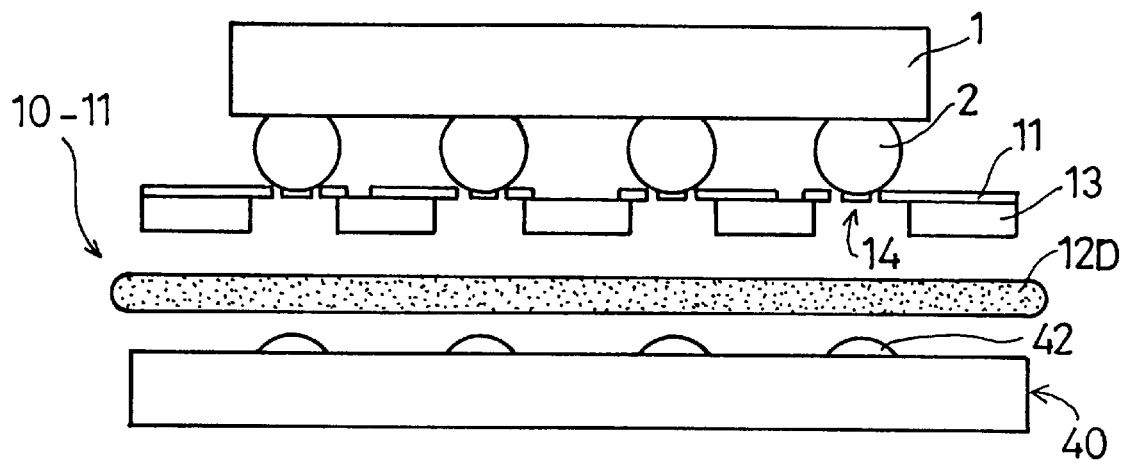
FIG. 14 illustrates a semiconductor inspection apparatus in an eleventh embodiment of the present invention.

FIG. 13 shows an exploded view of a semiconductor inspection apparatus 10-10 in the tenth embodiment, and FIG. 14 shows an exploded view of a semiconductor inspection apparatus 10-11 in the eleventh embodiment. As shown in FIG. 13, in the semiconductor inspection apparatus 10-10 in the tenth embodiment, a supporting member 40 is provided underneath the shock absorbing member 12D, and also, depressions 41 are formed in the supporting member 40. The depressions 41 are positioned so as to be aligned with the connection portions 14, respectively.

In the semiconductor inspection apparatus 10-11 in the eleventh embodiment shown in FIG. 14, a supporting member 40 is provided underneath the shock absorbing member 12D, and also, projections 42 are formed on the supporting member 40. The projections 42 are positioned so as to be aligned with the connection portions 14, respectively.

By forming the depressions 41 in or projections 42 on the supporting member 40 at the positions to be aligned with the connection portions 14, respectively, the shock absorbing function of the shock absorbing member 12D can be effectively used. Specifically, in the case where the depressions 41 are formed in the supporting member 40, even if the spherical connection terminals 2 are pressed with an excessive pressing force, and thereby, a large change of the shape of the shock absorbing member 12D occurs, this large change of the shape of the shock absorbing member 12D can be received by the depressions 41. Accordingly, it is possible to maintain the shock absorbing function of the shock absorbing member 12D.

In the case where the projections 42 are formed on the supporting member 40, even if the spherical connection terminals 2 are pressed with an excessive pressing force, and thereby, a large change of the shape of the shock absorbing member 12D would normally occur, the change of the shape of the shock absorbing member 12D is restrained by the projections 42 and actually a large change of the shape of the shock absorbing member 12D does not occur. Thereby, the shock absorbing member can be protected. Therefore, according to a desired one of the above-mentioned functions, the depressions 41 or the projections 42 may be selected.

Twelfth through thirty-third embodiments of the present invention will now be described.

In each of the semiconductor inspection apparatuses 10-1 through 10-11 of the respective embodiments, inspection is performed after the spherical connection terminals 2 provided on the semiconductor device 1 come into contact with and are pressed to the connection portions 14 of the semiconductor apparatus, respectively. Accordingly, accurate inspection cannot be performed unless the spherical connection terminals 2 and the connection portions 14 are accurately positioned.

In each embodiment which will be described, a positioning mechanism for positioning the semiconductor device (spherical connection terminal 2) with respect to the connection portions 14 is provided.

First, with reference to FIGS. 15 through 23, structures using guide pins as the positioning mechanisms will be described. The material of the guide pins used in each embodiment which will be described is preferably an insulating and low-thermal-expansion-coefficient material.

Figure 15:
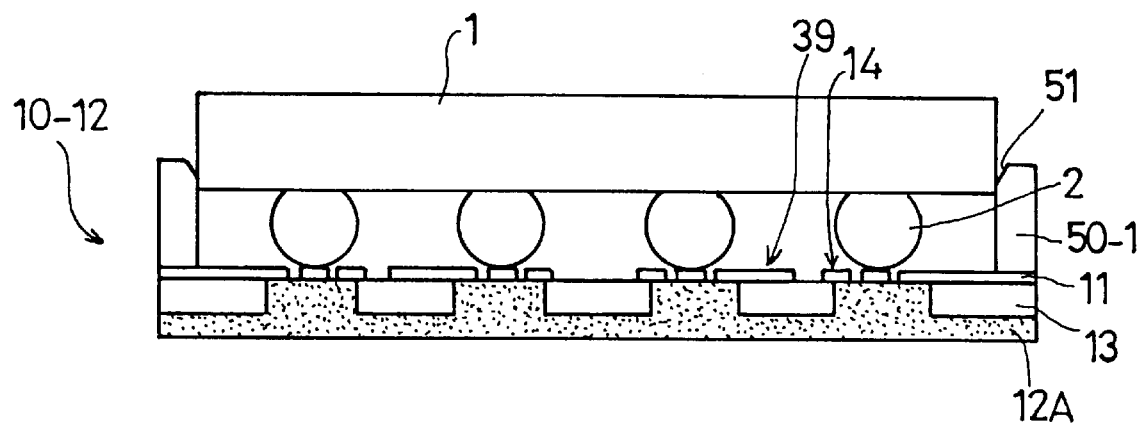
FIG. 15 illustrates a semiconductor inspection apparatus in a twelfth embodiment of the present invention.

In a semiconductor inspection apparatus 10-12 in the twelfth embodiment shown in FIG. 15, guide pins 50-1 are provided to stand on the substrate 39 which includes the conductor layers 11 and the supporting film 13. The positions of the inner surfaces of the guide pins 50-1 are coincident with the peripheral positions of the semiconductor device 1 which is loaded accurately.

Accordingly, by being guided by the guide pins 50-1 and loading the semiconductor device 1 on the semiconductor inspection apparatus 10-12, the positioning between the spherical connection terminals 2 and the connection portions 14 can be performed. At the projecting ends of the guide pins 50-1, taper portions 51 are formed, respectively, for enabling easy loading of the semiconductor device 1.

Figure 16:
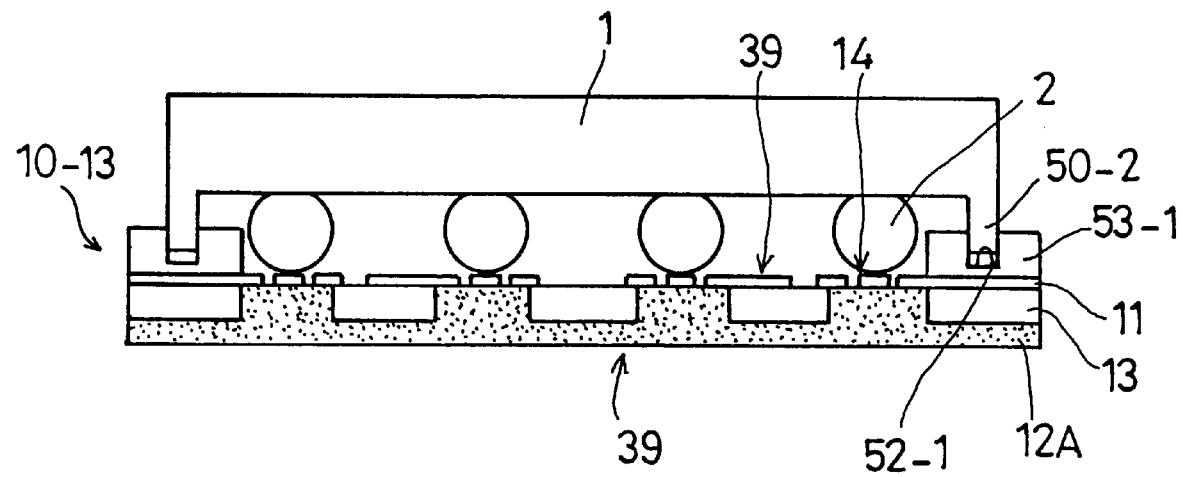
FIG. 16 illustrates a semiconductor inspection apparatus in a thirteenth embodiment of the present invention.

In a semiconductor inspection apparatus 10-13 in the thirteenth embodiment shown in FIG. 16, guide pins 50-2 are provided to the semiconductor device 1, and also, guides 53-1 having positioning holes 52-1, respectively, into which the guide pins 50-2 fit, respectively, are provided to the substrate 39. In this arrangement, as a result of the guide pins 50-2 provided to the semiconductor 1 fitting into the positioning holes 52-1 formed in the guides 53-1, respectively, the positioning between the spherical connection terminals 2 and the connection portions 14 is performed.

Figure 17:
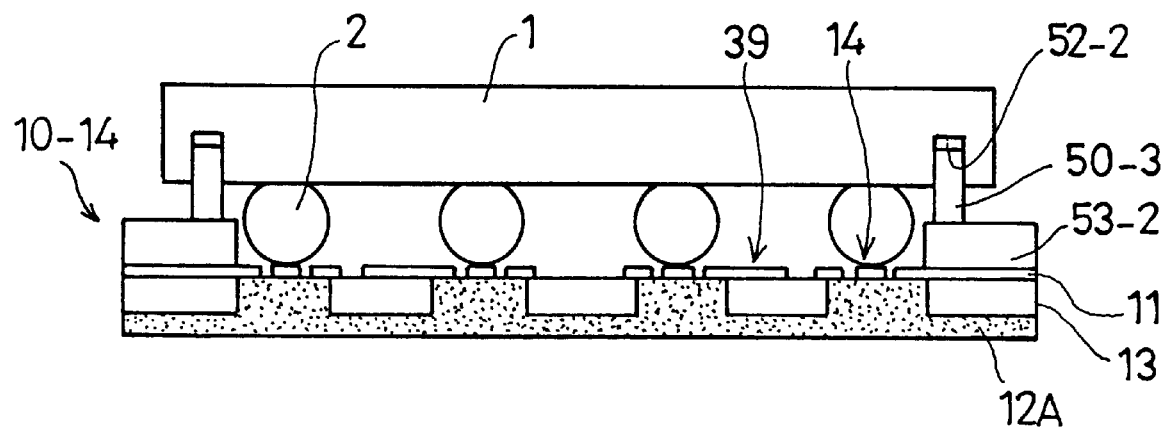
FIG. 17 illustrates a semiconductor inspection apparatus in a fourteenth embodiment of the present invention.

In a semiconductor inspection apparatus 10-14 in the fourteenth embodiment shown in FIG. 17, positioning holes 52-2 are formed in the semiconductor device 1, and also, guide pins 50-3 are provided to guides 53-2 provided on the substrate 39, respectively. In this arrangement, as a result of the guide pins 50-3 provided to stand on the guides 53-2 fitting into the positioning holes 52-2 formed in the semiconductor device 1, respectively, the positioning between the spherical connection terminals 2 and the connection portions 14 is performed.

Figure 18A:
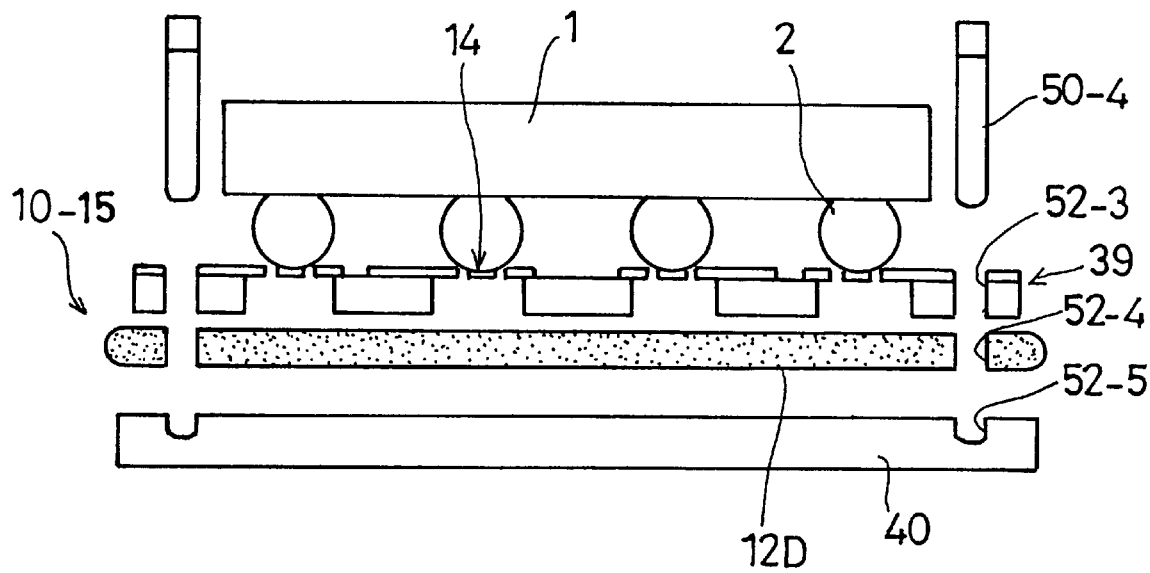
FIGS. 18A and 18B illustrate a semiconductor inspection apparatus in a fifteenth embodiment of the present invention.
Figure 18B:
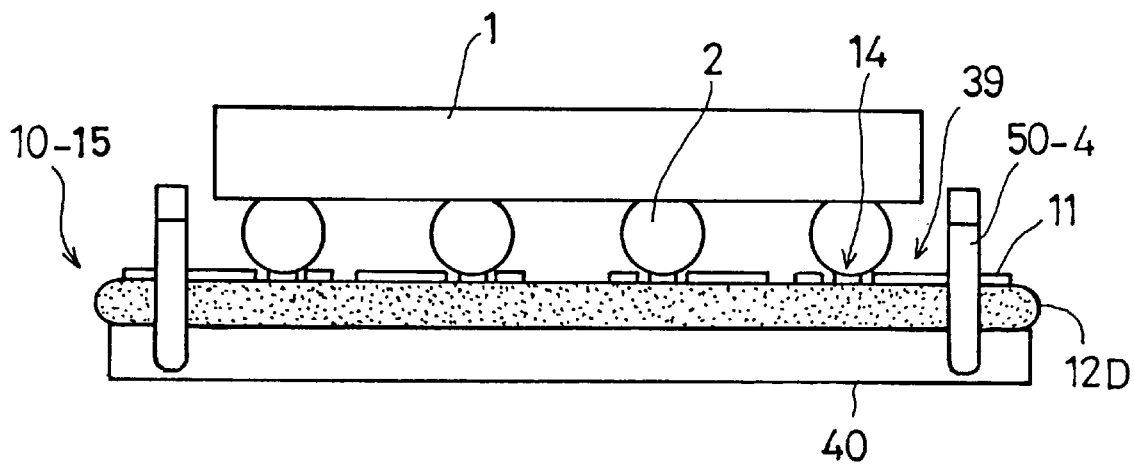

In a semiconductor inspection apparatus 10-15 in the fifteenth embodiment shown in FIGS. 18A and 18B, guide pins 50-4 are used for positioning the substrate 39 (including the conductor layers 11 and the supporting film 13), the shock absorbing member 12D and the supporting member 40. For this purpose, as shown in FIG. 18A, positioning holes 52-3 are formed at predetermined positions of the substrate 39, positioning holes 52-4 are formed at predetermined positions of the shock absorbing member 12D, and positioning holes 52-5 are formed at predetermined positions of the supporting member 40.

When performing the positioning, as shown in FIG. 18B, the guide pins are inserted to pass through the respective positioning holes 52-3, 52-4 and 52-5, respectively. Thus, the guide pins 50-4 control the positions of the substrate 39, shock absorbing member 12D and supporting member 40, and the substrate 39, shock absorbing member 12D and supporting member 40 are positioned with respect to each other. In order to perform high-accuracy inspection on the semiconductor device 1, it is important that the substrate 39, shock absorbing member 12D and supporting member 40 are positioned with respect to each other.

Figure 19:
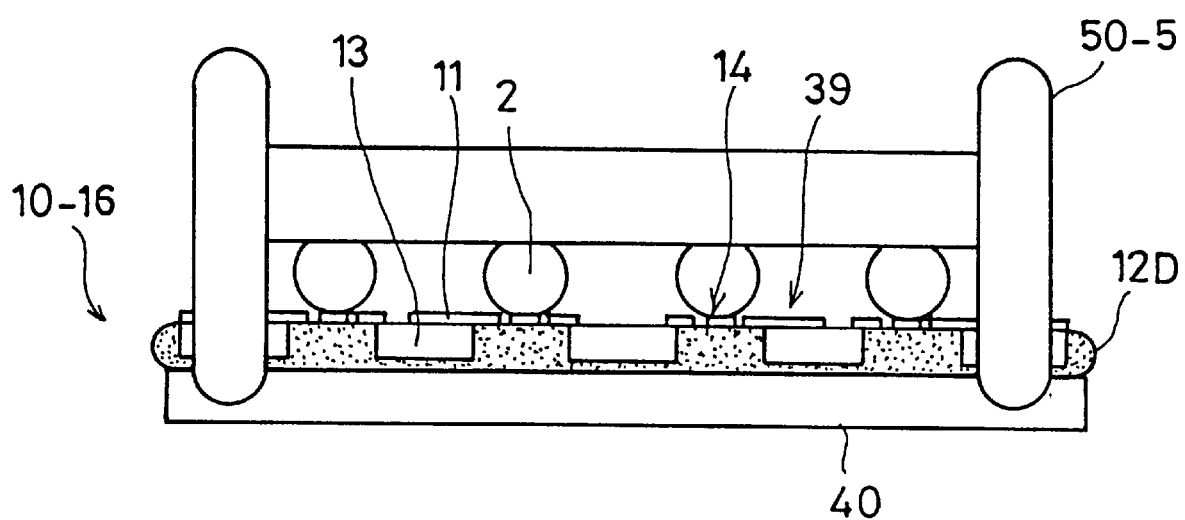
FIG. 19 illustrates a semiconductor inspection apparatus in sixteenth embodiment of the present invention.

In a semiconductor inspection apparatus 10-16 in the sixteenth embodiment shown in FIG. 19, similar to the above-described fifteenth embodiment, guide pins 50-5 are used for positioning the substrate 39, shock absorbing member 12D and supporting member 40. Further, in this embodiment, the guide pins 50-5 also guide the semiconductor device 1.

Specifically, the positions of the inner surfaces of the guide pins 50-5 are coincident with the peripheral position of the semiconductor device 1 which is loaded on a predetermined loading position, in the condition where the guide pins 50-5 have been inserted and loaded into the substrate 39, shock absorbing member 12D and supporting member 40.

Thereby, by being guided by the guide pins 50-5 which have been inserted and loaded into the substrate 39, shock absorbing member 12D and supporting member 40, and loading the semiconductor device 1 on the semiconductor inspection device 10-16, the positioning between the spherical connection terminals 2 and the connection portions 14 can be performed. Each of the extending ends of the guide pins 50-5 is hemispheric so as to enable easy loading of the semiconductor device 1, and also enable easy loading of the guide pins 50-5 into the substrate 39, shock absorbing member 12D and supporting member 40.

Figure 20A:
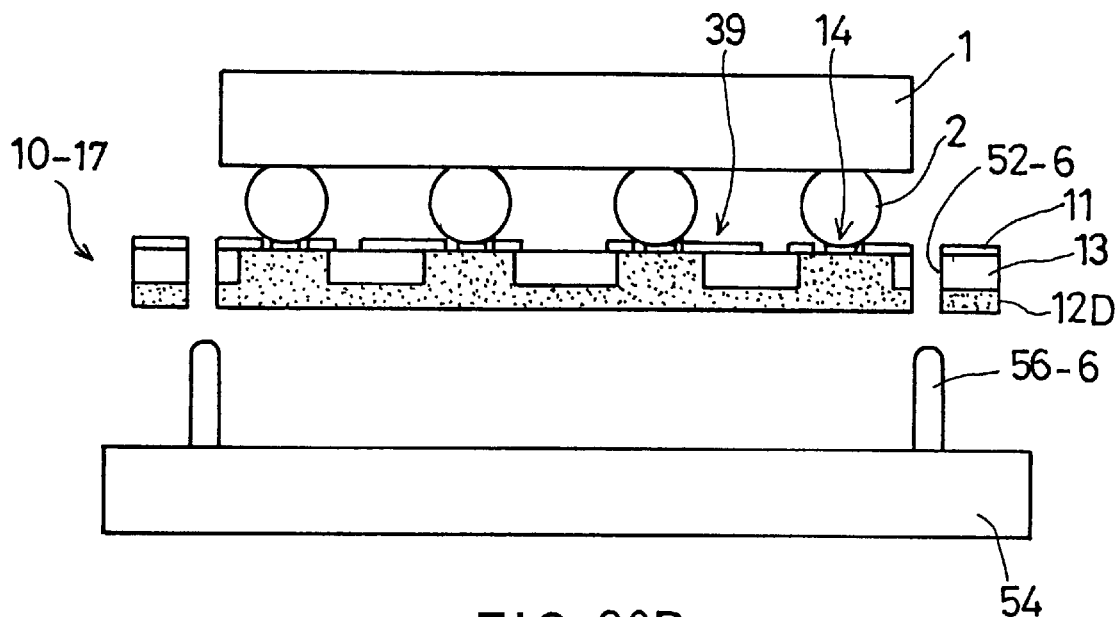
FIGS. 20A and 20B illustrate a semiconductor inspection apparatus in a seventeenth embodiment of the present invention.
Figure 20B:
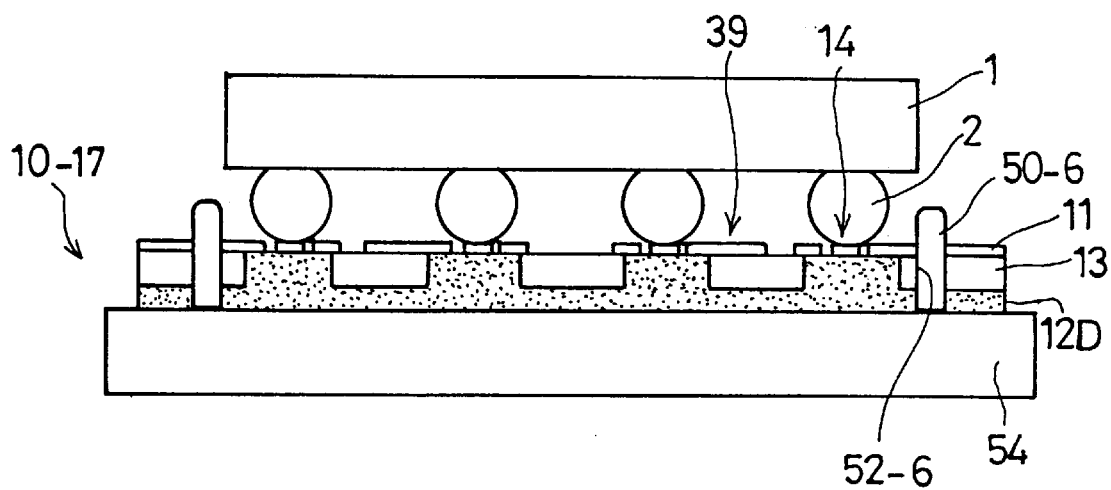

In a semiconductor inspection apparatus 10-17 in the seventeenth embodiment shown in FIGS. 20A and 20B, in an arrangement in which the shock absorbing member 12A and the substrate 39 (including the conductor layers 11 and the supporting film 13) are integrated, a stage 54 is further provided, and also, guide pins 50-6 are provided to stand on the stage 54.

Positioning holes 52-6 are previously formed in the shock absorbing member 12A and the substrate 39. Thereby, by causing the guide pins 50-6 to pass through the positioning holes 52-6, respectively, and thus loading the semiconductor inspection apparatus 10-17 on the stage 54, the semiconductor inspection apparatus 10-17 can be positioned with respect to the stage 54.

FIG. 20A shows a state before the semiconductor inspection apparatus 10-17 has been loaded on the stage 54. FIG. 20B shows a state after the semiconductor inspection apparatus 10-17 has been loaded on the stage 54.

Figure 21:
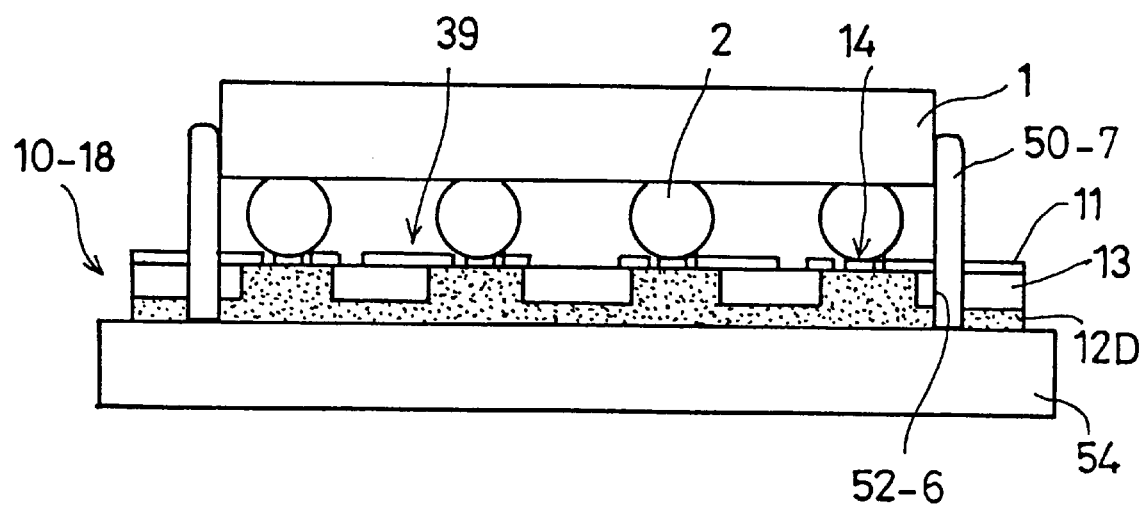
FIG. 21 illustrates a semiconductor inspection apparatus in an eighteenth embodiment of the present invention.

In a semiconductor inspection apparatus 10-18 in the eighteenth embodiment shown in FIG. 21, similar to the above-described seventeenth embodiment, guide pins 50-7 are used for positioning of the shock absorbing member 12A and substrate 39 with respect to the stage 54. Further, in the semiconductor inspection apparatus 10-18 in this embodiment, the guide pins 50-7 guide the semiconductor device 1. Specifically, the positions of the inner surfaces of the guide pins 50-7 are coincident with the peripheral positions of the semiconductor device 1 which is loaded on a predetermined loading position, in the condition where the guide pins 50-7 have been inserted and loaded into the shock absorbing member 12D and substrate 39.

Thereby, by being guided by the guide pins 50-7 which have been inserted and loaded into the shock absorbing member 12D and substrate 39, and loading the semiconductor device 1 on the semiconductor inspection device 10-18, the positioning between the spherical connection terminals 2 and the connection portions 14 can be performed. Each of the extending ends of the guide pins 50-7 is hemispheric so as to enable easy loading of the semiconductor device 1.

Figure 22A:
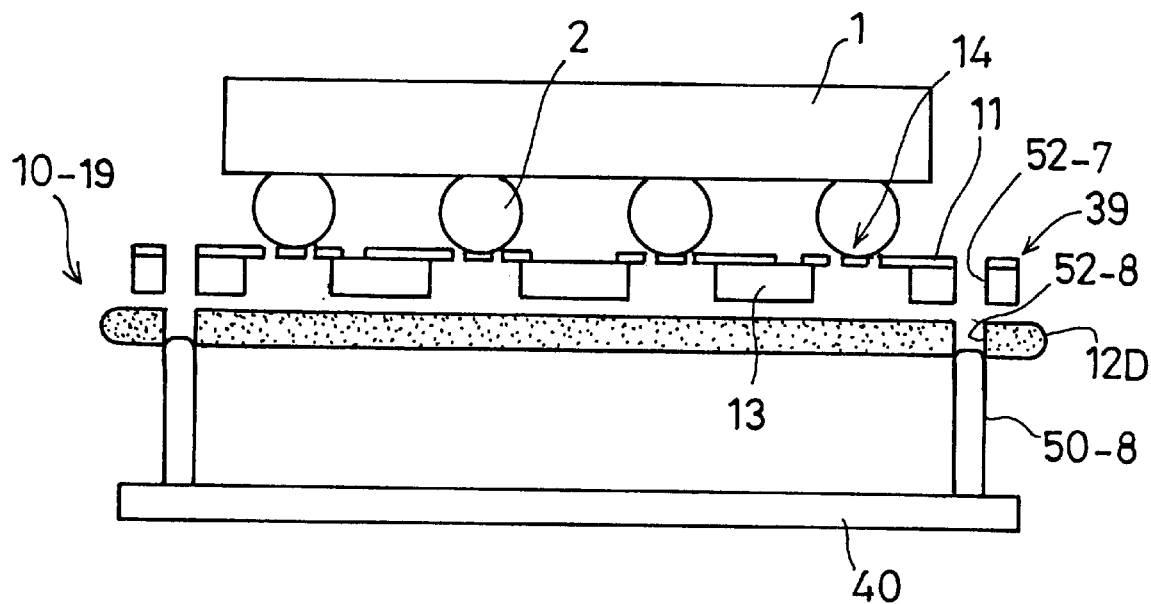
FIGS. 22A and 22B illustrate a semiconductor inspection apparatus in a nineteenth embodiment of the present invention.
Figure 22B:
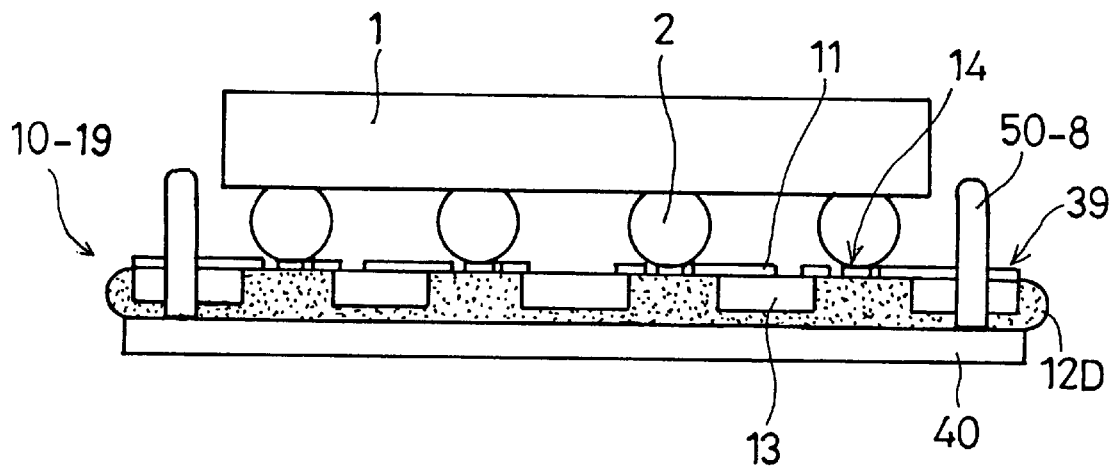

In a semiconductor inspection apparatus 10-19 in the nineteenth embodiment shown in FIGS. 22A and 22B, guide pins 50-8, for positioning the substrate 39 (including the conductor layers 11 and supporting film 13), shock absorbing member 12D and supporting member 40, are provided to stand on the supporting member 40. Therefore, in the semiconductor inspection apparatus 10-19 in this embodiment, as shown in FIG. 22A, positioning holes 52-7 and 52-8 are formed in the substrate 39 and shock absorbing member 12D.

When performing the positioning process, as shown in FIG. 22B, the guide pins 50-8 provided to stand on the supporting member 40 are inserted into so as to pass through the respective positioning holes 52-8 and 52-7, respectively. Thereby, the positions of the substrate 39 and shock absorbing member 12D are controlled, and thereby, the positioning of the substrate 39 and shock absorbing member 12D with respect to the supporting member 40 is performed.

As described above, in order to perform high-accuracy inspection on the semiconductor device 1, positioning of the substrate 39, shock absorbing member 12D and supporting member 40 with respect to each other is important. Accordingly, the arrangement of this embodiment enables performing of high-accuracy inspection on the semiconductor device 1. Further, because the guide pins 50-8 are fixed to the supporting member 40, loss of the guide pins 50-8 can be prevented.

Figure 23:
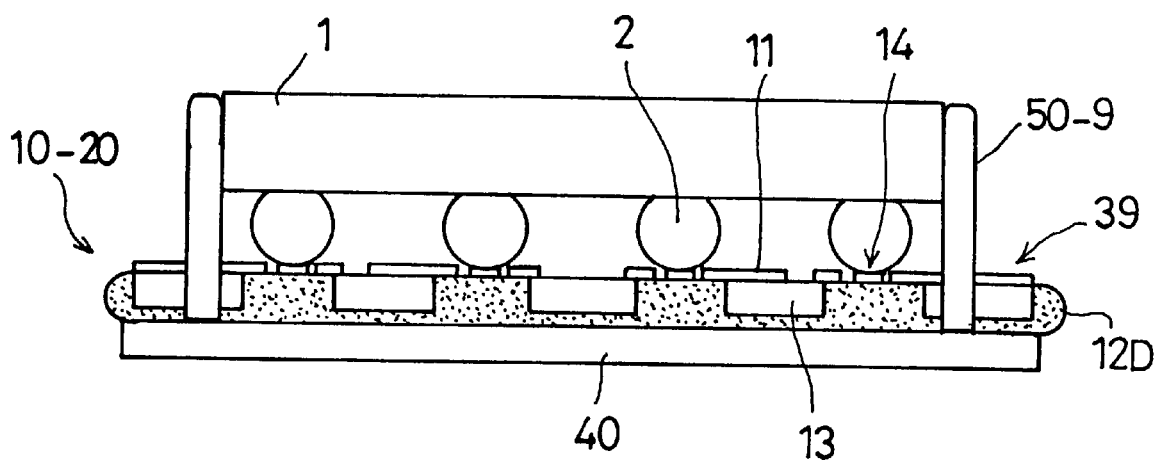
FIG. 23 illustrates a semiconductor inspection apparatus in a twentieth embodiment of the present invention.

In a semiconductor inspection apparatus 10-20 in the twentieth embodiment shown in FIG. 23, similar to the above-described nineteenth embodiment, guide pins 50-9, which are provided to stand on the supporting member 40, are used for positioning the substrate 39, shock absorbing member 12D and supporting member 40. Further, in the semiconductor inspection apparatus 10-20 in this embodiment, the guide pins 50-9 also guide the semiconductor device 1.

Specifically, the positions of the inner surfaces of the guide pins 50-9 are coincident with the peripheral positions of the semiconductor device 1 which is loaded on a predetermined loading position, in the condition where the guide pins 50-9 have been inserted and loaded into the substrate 39 and shock absorbing member 12D.

Thereby, by being guided by the guide pins 50-9 which have been inserted and loaded into the substrate 39 and shock absorbing member 12D, and loading the semiconductor device 1 on the semiconductor inspection device 10-20, the positioning between the spherical connection terminals 2 and the connection portions 14 can be performed. Each of the extending ends of the guide pins 50-9 is hemispheric so as to enable easy loading of the semiconductor device 1.

In the above-described twelfth through twentieth embodiments, the guide pins 50-1 through 50-9 are used, respectively, as the positioning mechanism. Thus, the simple arrangements enable the positioning between the spherical connection terminals 2 and the connection portions 14.

With reference to FIGS. 24A through 30, arrangements using guide-pin-attached frames will now be described.

FIGS. 24A, 24B, 24C and 24D show a semiconductor inspection apparatus 10-21 in the twenty-first embodiment. In this embodiment, the guide-pin-attached frame 60-1 is used for positioning the substrate 39 (including the conductor layers 11 and supporting film 13), shock absorbing member 12D and supporting member 40.

The guide-pin-attached frame 60-1 includes a frame body portion 61 which functions as a frame and guide pin portions 62 which are fixed to the frame body portion 61. As shown in FIGS. 24B and 24C, the frame body portion 61 has a frame shape and has a space portion 63 inside thereof. The shape of the space portion 63 corresponds to the outer shape of the semiconductor device 1. The guide pin portions 62 extend downward from four corner positions of the frame body portion 61.

Figure 24A:
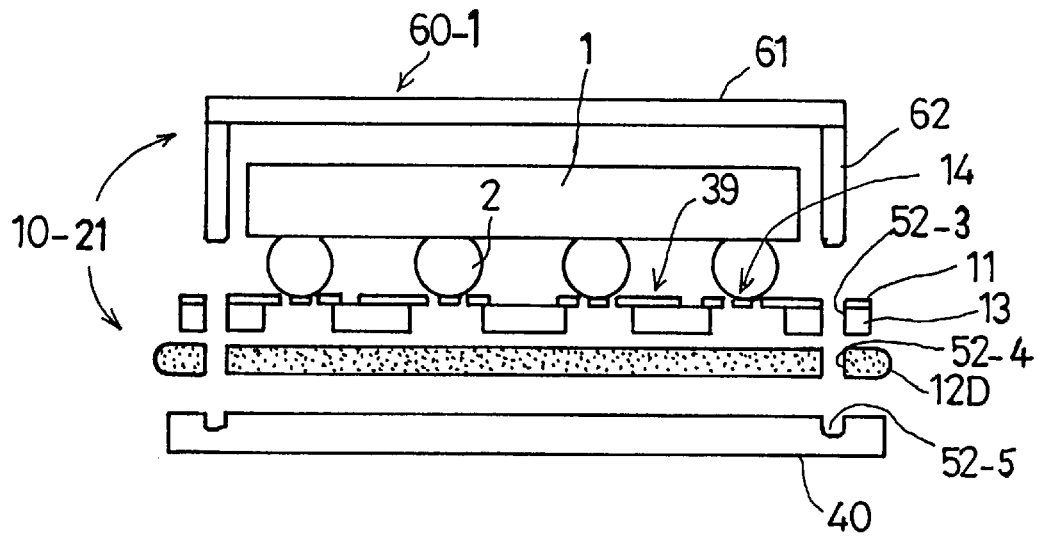
FIGS. 24A, 24B, 24C and 24D illustrate a semiconductor inspection apparatus in a twenty-first embodiment of the present invention.
Figure 24B:
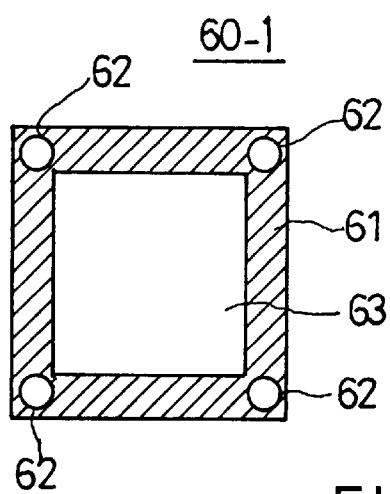
Figure 24C:
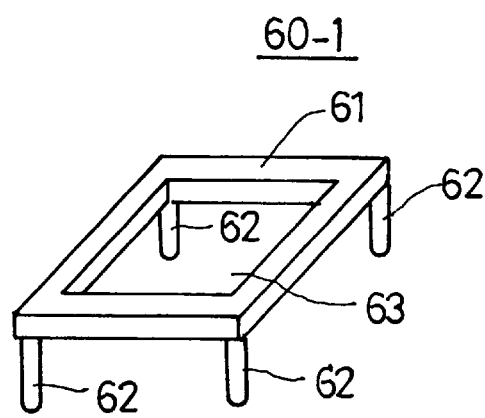

As shown in FIG. 24A, positioning holes 52-3 are formed in the substrate 39 at predetermined positions, positioning holes 52-4 are formed in the shock absorbing member 12D at predetermined positions, and positioning holes 52-5 are formed in the supporting member 40 at predetermined positions. The positions of the respective positioning holes 52-3 through 52-5 correspond to the positions of the guide pin portions 62 of the guide-pin-attached frame 60-1.

Figure 24D:
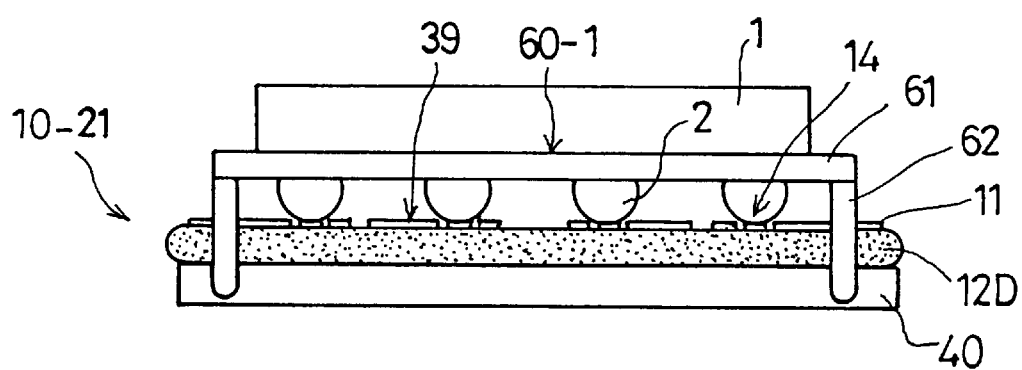

When performing the positioning process in the above-described semiconductor inspection apparatus 10-21, as shown in FIG. 24D, the guide pin portions 62 of the guide-pin-attached frame 60-1 are inserted into the respective positioning holes 52-3 through 52-5. Thereby, the positions of the substrate 39, shock absorbing member 12D and supporting member 40 are controlled by the guide pin portions 62, and thus they are positioned with respect to each other.

Further, the guide-pin-attached frame 60-1 includes the frame body portion 61 having the space portion 63 formed therein, the shape of the space portion 63 corresponding to the outer shape of the semiconductor device 1. Using the frame body portion 61, positioning of the semiconductor device 1 can be performed. Thus, in the semiconductor inspection apparatus 10-21 in this embodiment, the positioning of the substrate 39, shock absorbing member 12D, supporting member 40 and semiconductor device 1 can be easily performed. Thereby, it is possible to perform high-accuracy inspection on the semiconductor device 1.

FIGS. 24A through 24D show the process that the guide-pin-attached frame 60-1 is loaded and the positioning is performed after the semiconductor device 1 and the connection portions 14 are connected with one another. However, it is also possible that the guide-pin-attached frame 60-1 is loaded and thus the positioning of the substrate 39, shock absorbing member 12D and supporting member 40 is performed, and then, the frame-body member 61 is used to provide a reference position, the semiconductor device 1 is loaded and thus the positioning of the semiconductor device 1 is performed.

Figure 25A:
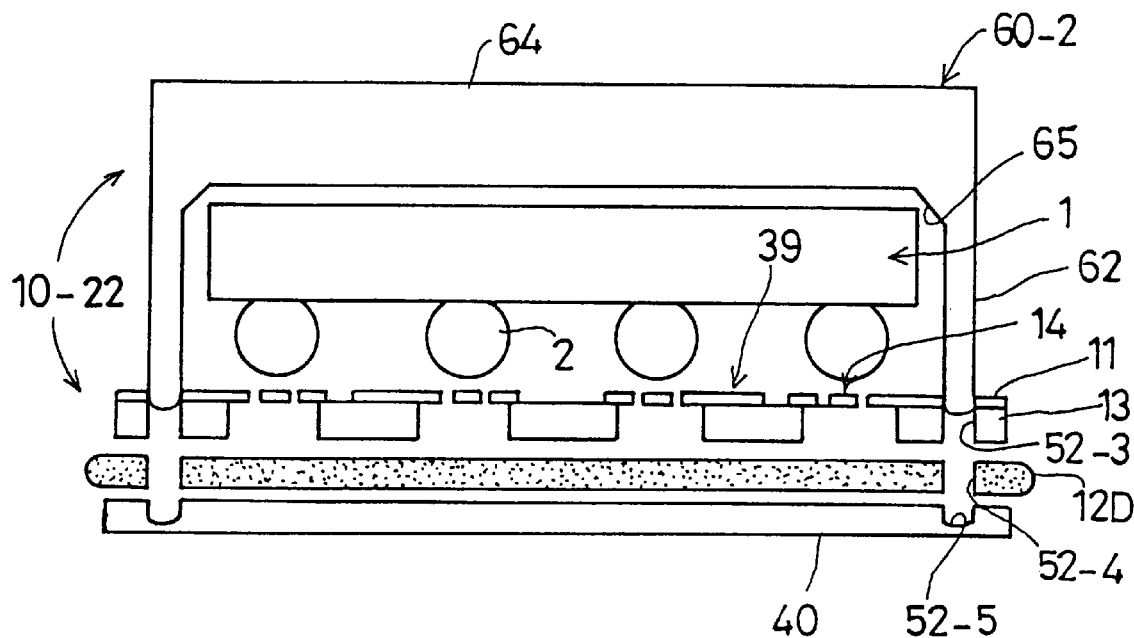
FIGS. 25A and 25B illustrate a semiconductor inspection apparatus in a twenty-second embodiment of the present invention.
Figure 25B:
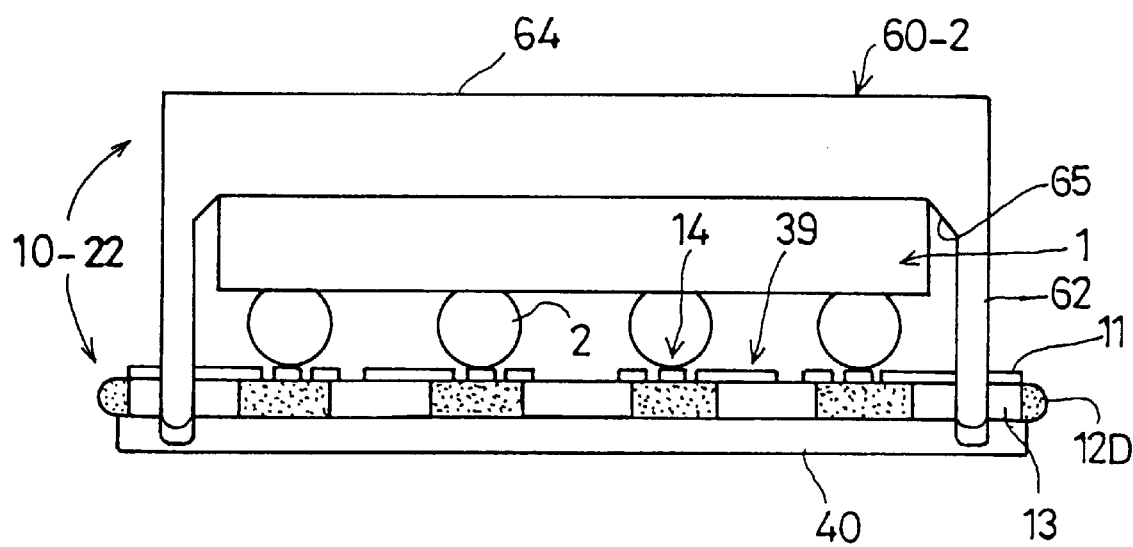

FIGS. 25A and 25B show a semiconductor inspection apparatus 10-22 in the twenty-second embodiment. A frame portion 64 of the guide-pin-attached frame 60-2 of this embodiment covers and holds the semiconductor device 1. Further, taper surfaces 65 for positioning the semiconductor device 1 are formed on the inner walls of the frame portion 64. The taper surfaces 65 are formed at such positions as to face the peripheral portion of the top surface of the semiconductor device 1. The guide pin portions 62 extend downward from four corners of the bottom surface of the frame portion 64.

As shown in FIG. 25A, positioning holes 52-3 are formed in the substrate 39 at predetermined positions, positioning holes 52-4 are formed in the shock absorbing member 12D at predetermined positions, and positioning holes 52-5 are formed in the supporting member 40 at predetermined positions. The positions of the respective positioning holes 52-3 through 52-5 correspond to the positions of the guide pin portions 62 of the guide-pin-attached frame 60-2.

When performing the positioning process in the above-described semiconductor inspection apparatus 10-22, as shown in FIG. 25B, the guide pin portions 62 of the guide-pin-attached frame 60-2 are inserted into the respective positioning holes 52-3 through 52-5. Thereby, the positions of the substrate 39, shock absorbing member 12D and supporting member 40 are controlled by the guide pin portions 62, and thus they are positioned with respect to each other.

Further, as mentioned above, the taper surfaces 65 are formed on the inner walls of the frame portion 64 of the guide-pin-attached frame 60-2. Therefore, when the guide-pin-attached frame 60-2 is being loaded, the peripheral portion of the top surface of the semiconductor device 1 comes into contact with the taper surfaces 65. Thereby, the position of the semiconductor device 1 is controlled by the taper surface 65 and thus the semiconductor device 1 is positioned. Thus, in the semiconductor inspection apparatus 10-22 in this embodiment, the positioning of the substrate 39, shock absorbing member 12D, supporting member 40 and semiconductor device 1 can be easily performed. Thereby, it is possible to perform high-accuracy inspection on the semiconductor device 1.

Figure 26:
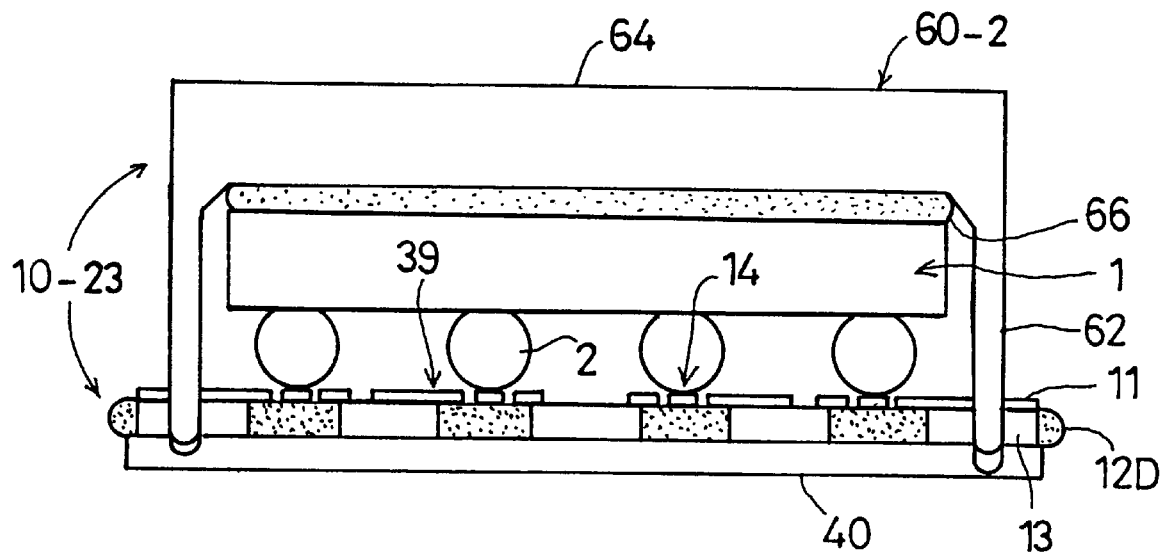
FIG. 26 illustrates a semiconductor inspection apparatus in a twenty-third embodiment of the present invention.

FIG. 26 shows a semiconductor inspection apparatus 10-23 in the twenty-third embodiment.

The basic arrangement of the semiconductor inspection apparatus 10-23 in this embodiment is the same as the above-described semiconductor inspection apparatus 10-22 in the twenty-second embodiment. However, an elastomer 66 is provided to the bottom surface of the frame portion 64 of the guide-pin-attached frame 60-2 at such a position as to face the top surface of the semiconductor device 1. The elastomer 66 is made of a material having flexibility (such as silicone rubber or the like) and has a shock absorbing function.

As a result of providing the elastomer 66 between the frame portion 64 and the semiconductor device 1, even if the guide-pin-attached frame 60-2 is strongly pressed to the substrate 39, the shock of the pressing force is absorbed by the shock absorbing member 12D and the elastomer 66. Thereby, the connected portions of the spherical connection terminals 2 and the connection portions 14D are prevented from having excessive stress applied thereto. Accordingly, damage or deformation of the spherical connection terminals 2 can be prevented.

Figure 27:
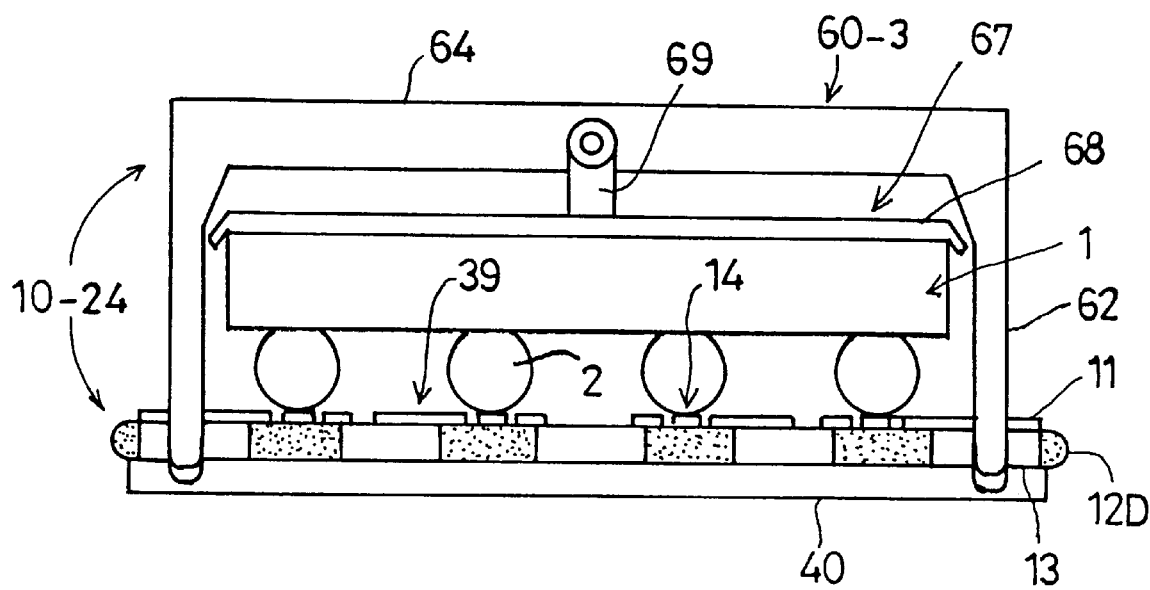
FIG. 27 illustrates a semiconductor inspection apparatus in a twenty-fourth embodiment of the present invention.

FIG. 27 shows a semiconductor inspection apparatus 10-24 in the twenty-fourth embodiment.

In the semiconductor inspection apparatus 10-24 in this embodiment, an aligning mechanism 67, which performs an aligning process on the semiconductor device 1, is provided inside the frame portion 64 of the guide-pin-attached frame 60-3. The aligning mechanism 67 includes a loaded portion 68, which is loaded on the top surface of the semiconductor device 1, and a swinging arm 69, which rotateably connects the loaded portion 68 to the frame portion 64.

When the semiconductor device 1 shifts horizontally so that the spherical connection terminals 2 connect with the predetermined connection portions 14, respectively, the aligning mechanism 67 allows the loaded portion 68 to shift so as to follow the semiconductor device 1. Thus, the aligning mechanism 67 performs the aligning process so that the spherical connection terminals 2 are positioned on the connection portions 14, respectively. By providing the above-described aligning mechanism 67, even if the positions of the spherical connection terminals 2 are not coincident with the positions of the connection portions 14, respectively, immediately after the semiconductor device 1 is inserted into the frame portion 64, the aligning mechanism 67 performs the aligning process and thus the positions of the spherical connection terminals 2 become coincident with the positions of the connection portions 14, respectively.

Figure 28:
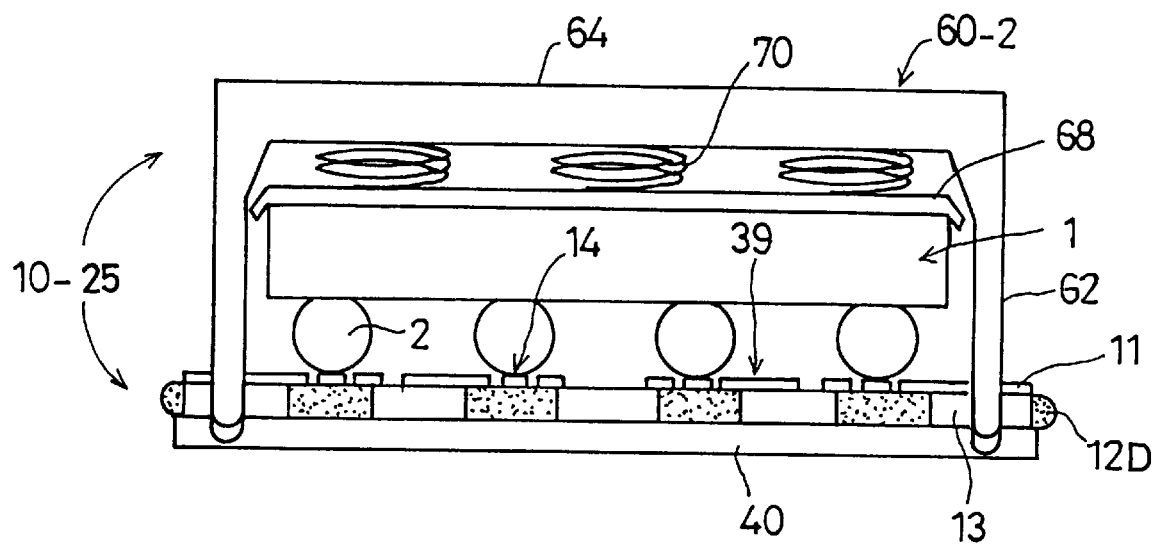
FIG. 28 illustrates a semiconductor inspection apparatus in a twenty-fifth embodiment of the present invention.

FIG. 28 shows a semiconductor inspection apparatus 10-25 in the twenty-fifth embodiment.

In the semiconductor inspection apparatus 10-25 in this embodiment, coil springs 70 are provided between the frame portion 64 of the guide-pin-attached frame 60-2 and a loaded portion 68 which is loaded on the top surface of the semiconductor device 1. These coil springs 70 apply a force to the semiconductor device 1, which has been loaded, so that the semiconductor device 1 is pressed to the substrate 39 (conductor layers 11).

By providing the coil springs 70 between the frame portion 64 and the loaded portion 68, the spherical connection terminals 2 are always pressed to the connection portions 14, respectively. Accordingly, it is possible to improve electrical connections between the spherical connection terminals 2 and the connection portions 14. Also, it is possible to prevent the spherical connection terminals 2 from shifting from the connection portions 14 during measurement.

Figure 29:
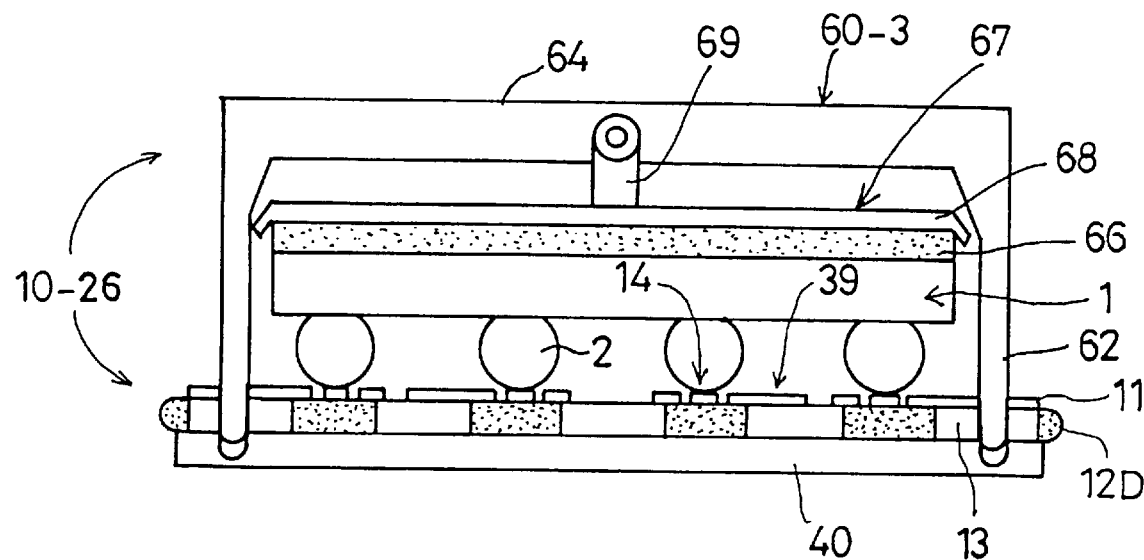
FIG. 29 illustrates a semiconductor inspection apparatus in twenty-sixth embodiment of the present invention.

FIG. 29 shows a semiconductor inspection apparatus 10-26 in the twenty-sixth embodiment.

The semiconductor inspection apparatus 10-26 is obtained from inserting the elastomer 66 between the loaded portion 68 and the top surface of the semiconductor device 1 in the semiconductor inspection apparatus 10-24 in the twenty-fourth embodiment shown in FIG. 27. In the twenty-sixth embodiment, the above-described effects of the twenty-third embodiment and also the effects of the twenty-fourth embodiment can be obtained.

Figure 30:
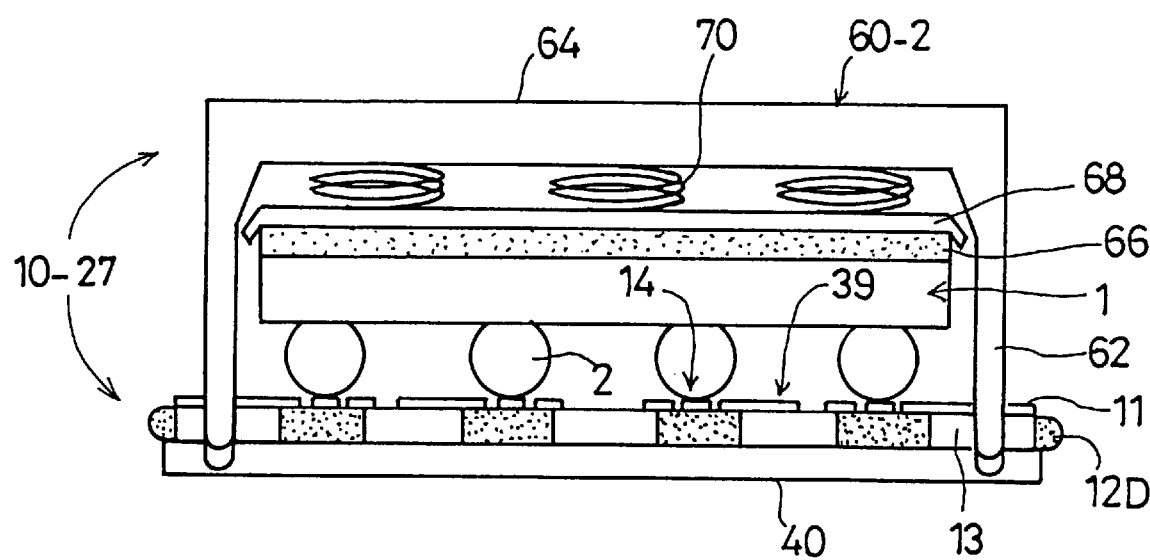
FIG. 30 illustrates a semiconductor inspection apparatus in a twenty-seventh embodiment of the present invention.

FIG. 30 shows a semiconductor inspection apparatus 10-27 in the twenty-seventh embodiment.

The semiconductor inspection apparatus 10-27 is obtained from inserting the elastomer 66 between the loaded portion 68 and the top surface of the semiconductor device 1 in the semiconductor inspection apparatus 10-25 in the twenty-fifth embodiment shown in FIG. 28. In the twenty-seventh embodiment, the above-described effects of the twenty-third embodiment and also the effects of the twenty-fifth embodiment can be obtained.

With reference to FIGS. 31 through 36, arrangements using positioning substrates as positioning mechanisms will now be described.

Figure 31A:
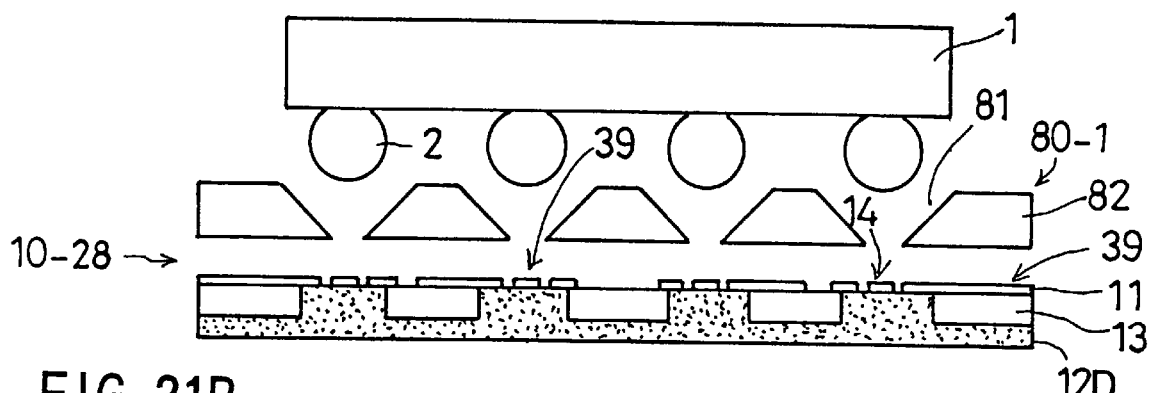
FIGS. 31A and 31B illustrate a semiconductor inspection apparatus in a twenty-eighth embodiment and an inspection method using the apparatus.
Figure 31B:
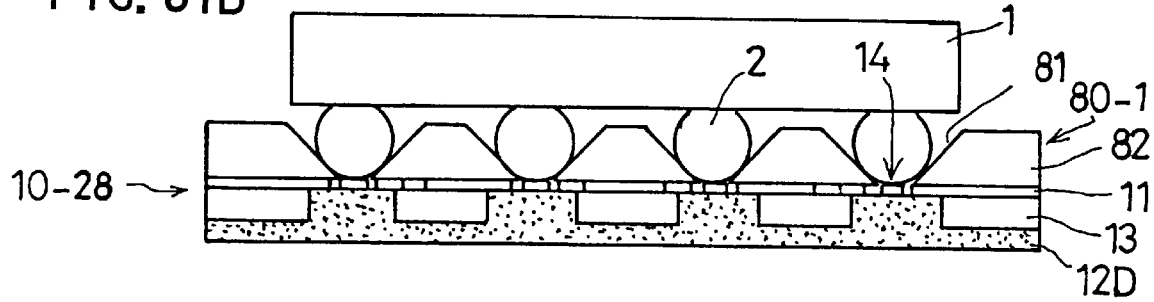

FIGS. 31A and 31B show a semiconductor inspection apparatus 10-28 in the twenty-eighth embodiment. In this embodiment, a positioning substrate 80-1, which has a plurality of holes 81 formed therein, is used for positioning the spherical connection terminals 2 of the semiconductor device 1 with respect to the connection portions 14.

As shown in FIG. 31A, the positioning substrate 80-1 is a plane-plate-shaped substrate body made of an insulating material having truncated-cone-shaped holes 81 formed therein. The positions of the holes 81 correspond to predetermined positions at which the spherical connection terminals 2 and the connection portions 14 are connected with each other, respectively. The positioning substrate 80-1 is positioned and provided on the substrate 39 which includes the conductor layers 11 and supporting film 13.

In the above-described semiconductor inspection apparatus 10-28, when positioning the spherical connection terminals 2 and the connection portions 14 with respect to one another, simply the semiconductor device 1 is placed on the positioning substrate 80-1. As mentioned above, the positions of the holes 81 formed in the positioning substrate 80-1 are the predetermined positions at which the spherical connection terminals 2 and the connection portions 14 are connected with one another, respectively. Further, each hole 18 has a truncated-cone shape. Accordingly, as a result of placing the semiconductor device 1 on the positioning substrate 80-1, the spherical connection terminals 2 are guided by the holes 81, respectively, and come into contact with the connection portions, respectively. FIG. 31B shows the state in which the spherical connection terminals 2 and the connection portions 14 are connected with one another, respectively.

Thus, in the semiconductor inspection apparatus 10-28 in this embodiment, only by simply loading the semiconductor device 1 on the positioning substrate 80-1 in a manner in which the spherical connection terminals 2 are inserted into the holes 81, respectively, the positioning between the spherical connection terminals 2 and the connection portions 14 can be performed. Thus, the positioning between the spherical connection terminals 2 and the connection portions 14 can be performed easily and efficiently.

Figure 32A:
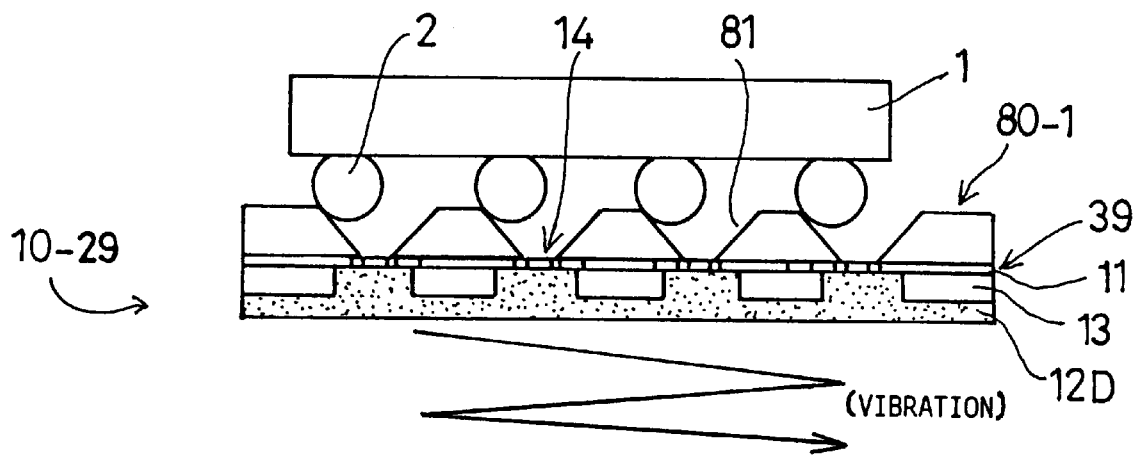
FIGS. 32A and 32B illustrate a semiconductor inspection apparatus in a twenty-ninth embodiment and an inspection method using the apparatus.
Figure 32B:
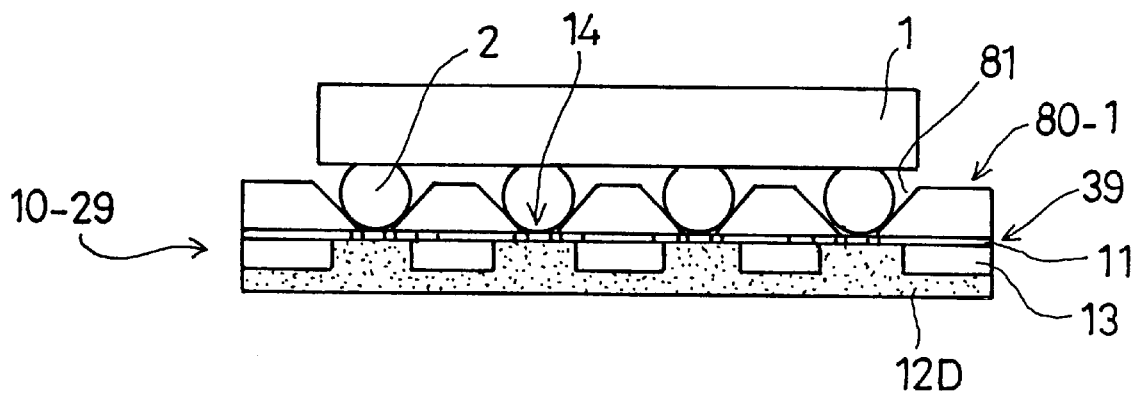

FIGS. 32A and 32B show a semiconductor inspection apparatus 10-29 in the twenty-ninth embodiment.

In this embodiment, vibration is used for positioning the spherical connection terminals 2 and connection portions 14 with respect to one another. Specifically, in this embodiment, a vibration generating apparatus (not shown in the figures) is connected to the positioning substrate 80-1. By driving the vibration generating apparatus, the positioning substrate 80-1 can be vibrated.

As shown in FIG. 32A, by vibrating the positioning substrate 80-1, the semiconductor device 1 relatively moves (vibrates) on the positioning substrate 80-1. Then, by this vibration of the semiconductor device 1, as shown in FIG. 32B, the spherical connection terminals 2 fit into the holes 81 of the positioning substrate 80-1, respectively. Thus, the positioning of the spherical connection terminals 2 is performed. Thus, in the semiconductor inspection apparatus 10-29 in this embodiment, the positioning between the spherical connection terminals 2 and the connection portions 14 can be performed easily and automatically.

Figure 33A:
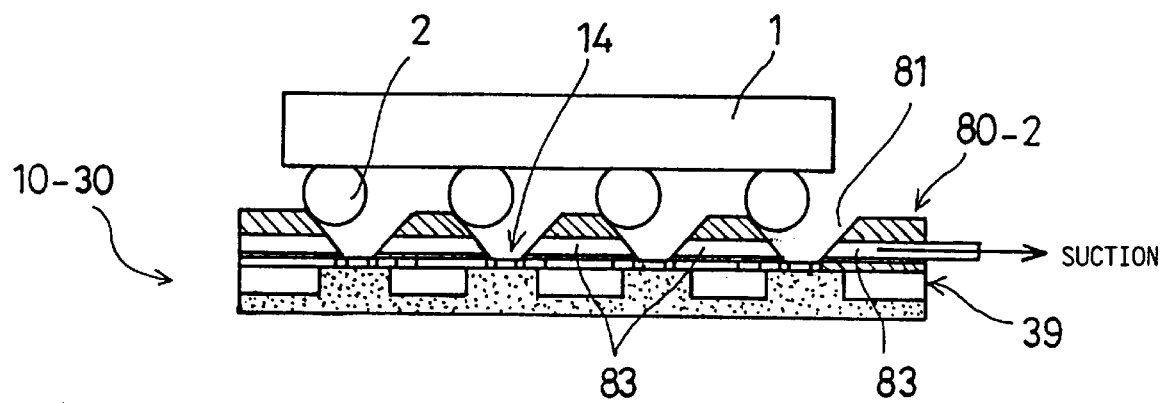
FIGS. 33A and 33B illustrate a semiconductor inspection apparatus in a thirtieth embodiment and an inspection method using the apparatus.
Figure 33B:
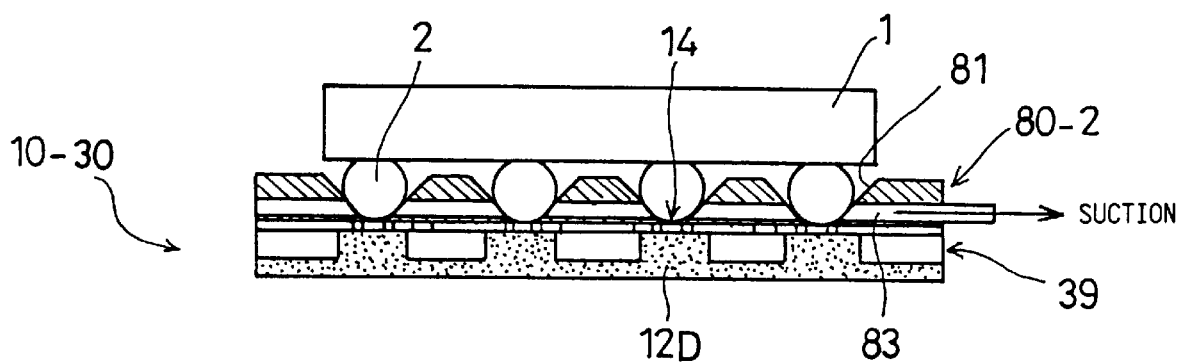

FIGS. 33A and 33B show a semiconductor inspection apparatus 10-30 in the thirtieth embodiment. In this embodiment, suction paths 83, which are connected to a vacuum suction apparatus (vacuum pump), are formed in the positioning substrate 80-2, and suction holes of the suction paths 83 are formed in the holes 81, respectively. Accordingly, by driving the vacuum pump and sucking air from the suction holes via the suction paths 83, the spherical connection terminals 2 are forcibly drawn into the holes 81, respectively. Thus, it is possible to positioning the spherical connection terminals 2 into the holes 81 (to the connection portions 14), respectively, with high accuracy.

Figure 34A:
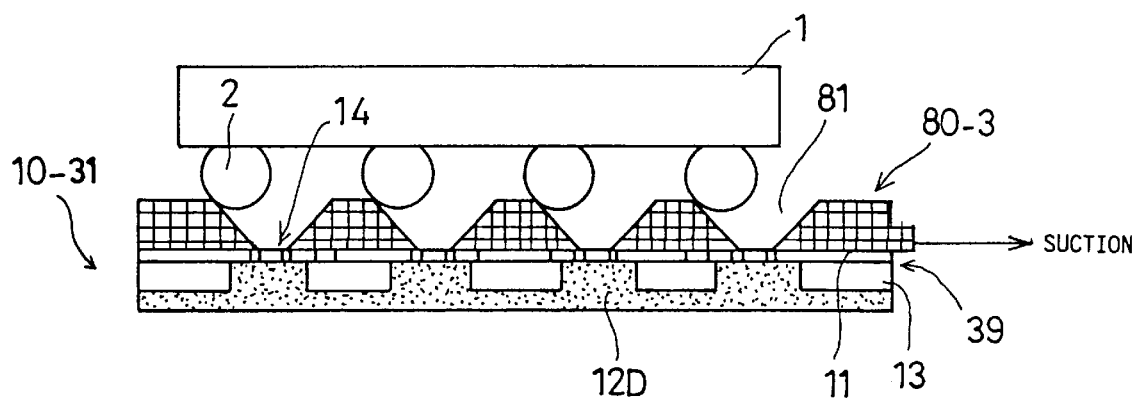
FIGS. 34A and 34B illustrate a semiconductor inspection apparatus in a thirty-first embodiment and an inspection method using the apparatus.
Figure 34B:
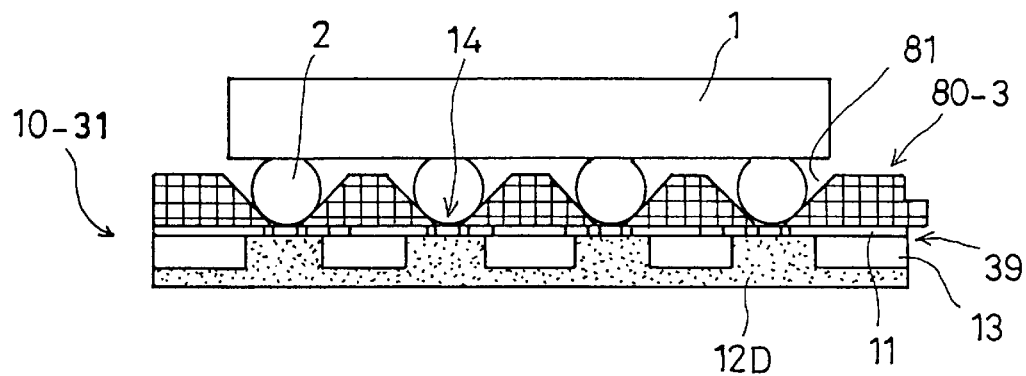

FIGS. 34A and 34B show a semiconductor inspection apparatus 10-31 in the thirty-first embodiment.

In this embodiment, the positioning substrate 80-3 is made of a porous material, and the positioning substrate 80-3 is connected to a vacuum suction apparatus (vacuum pump).

In this arrangement, when the vacuum pump is driven, because the positioning substrate 80-3 is made of the porous material, the entire surface of the semiconductor device 1 is drawn to the positioning substrate 80-3. Thereby, the spherical connection terminals 2 fit into the holes 81, respectively. Thus, it is possible to positioning the spherical connection terminals 2 into the holes 81 (to the connection portions 14), respectively, with high accuracy.

Figure 35:
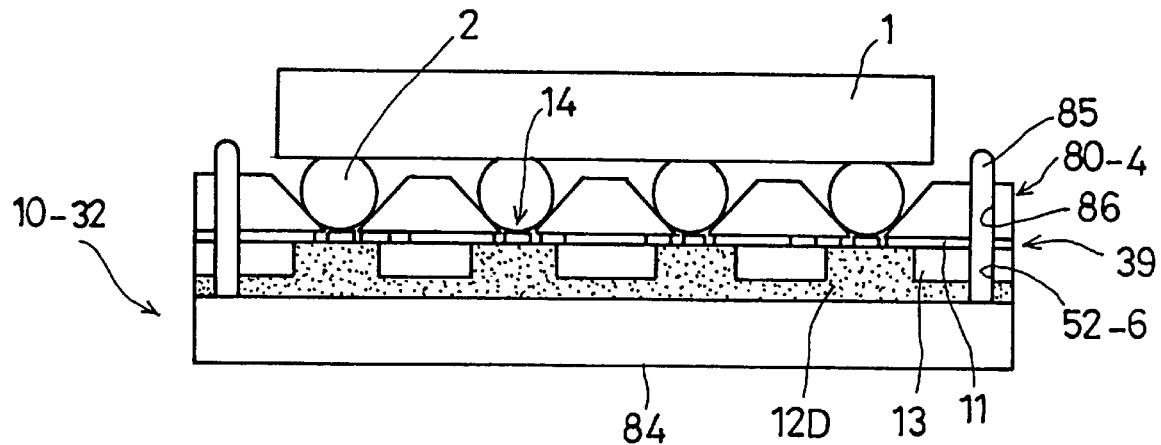
FIG. 35 illustrates a semiconductor inspection apparatus in a thirty-second embodiment of the present invention.
Figure 36:
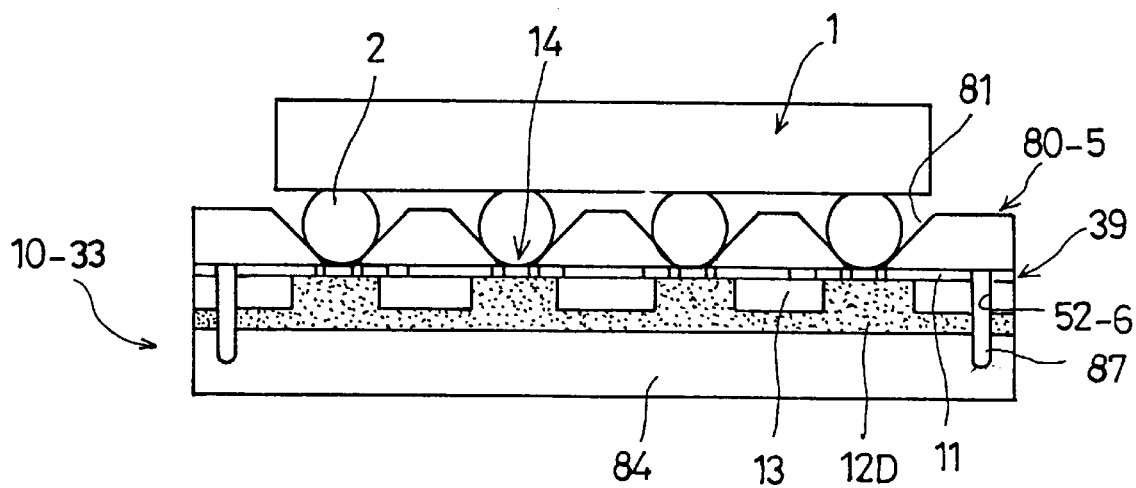
FIG. 36 illustrates a semiconductor inspection apparatus in a thirty-third embodiment of the present invention.

FIGS. 35 and 36 show positioning mechanisms for positioning the positioning substrate to the substrate 39.

In a semiconductor inspection apparatus 10-32 in the thirty-second embodiment shown in FIG. 35, a stage 84, which has positioning pins 85 provided to stand thereon, is used as the positioning mechanism. By inserting the positioning pins 85 into positioning holes 52-6 formed in the substrate 39 and shock absorbing member 12A, and into positioning holes 86 formed in the positioning substrate 80-4, the positioning substrate 80-4 is positioned to the substrate 38.

In a semiconductor inspection apparatus 10-33 in the thirty-third embodiment shown in FIG. 36, positioning pins 87 are provided so as to be connected to the positioning substrate 80-5 as the positioning mechanism. By inserting the positioning pins 87 into positioning holes 52-6 formed in the substrate 39 and shock absorbing member 12A, the positioning substrate 80-4 is positioned with respect to the substrate 39.

By positioning the positioning substrate 80-4 with respect to the substrate 39 using the positioning pins 85 as described above, it is possible to improve the positioning accuracy between the connection portions 14 and the holes 81 of the substrate 80-4. Similarly, by positioning the positioning substrate 80-5 to the substrate 39 using the positioning pins 87 as described above, it is possible to improve the positioning accuracy between the connection portions 14 and the holes 81 of the substrate 80-5. Accordingly, it is possible to improve the positioning accuracy between the spherical connection terminals 2 and the connection portions 14.

Further, the present invention is not limited to the above-described embodiments, and variations and modifications may be made without departing from the scope of the present invention claimed in the following claims.

What is claimed is:

1. A semiconductor inspection apparatus for performing a test on a to-be-inspected device which has a spherical connection terminal, said apparatus comprising:

a conductor layer formed on a supporting film, said conductor layer having a connection portion, said spherical connection terminal is connected to said connection portion, at least a shape of said connection portion being changeable; and a shock absorbing member, made of an elastically deformable and insulating material for at least supporting said connection portion and having an elastic restoring force for preventing permanent deformation of said connection portion, wherein said shock absorbing member is provided below said conductor layer, and wherein said shock absorbing member absorbs more stress than general semiconductor materials.

2. The semiconductor inspection apparatus according to claim 1, wherein said connection portion includes a ring-shaped portion and an extending portion which extends from said ring-shaped portion toward a center of said ring-shaped portion.

3. The semiconductor inspection apparatus according to claim 1, wherein a projection portion is formed to said shock absorbing member at a position at which said shock absorbing member faces said connection portion, said projecting portion projecting toward said connection portion.

4. An inspection method using a semiconductor inspection apparatus for performing a test on a to-be-inspected device which has a spherical connection device terminal, said apparatus comprising:

a conductor layer formed on a supporting film, said conductor layer having a connection portion, said spherical connection terminal is connected to said connection portion, at least a shape of said connection portion being changeable; and a shock absorbing member, made of an elastically deformable and insulating material, for at least supporting said connection portion, wherein said shock absorbing member absorbs more stress than general semiconductor materials, said inspection method comprising the step of pressing said spherical connection terminal to said connection portion formed in said conductor layer so that elastic deformation occurs in said connection portion of said conductor layer and said shock absorbing member, the elastic restoring force occurring in said connection portion and said shock absorbing member due to said elastic deformation causing said connection portion to be pressed to said spherical connection terminal so that electrical connection therebetween is provided, said elastic restoring force preventing permanent deformation of said connection portion.

\* \* \* \* \*